United States Patent
Masunaga et al.

(10) Patent No.: US 11,349,000 B2
(45) Date of Patent: May 31, 2022

(54) SEMICONDUCTOR DEVICE, MANUFACTURING METHOD THEREOF, AND PRESSURE TRANSMITTER USING SEMICONDUCTOR DEVICE

(71) Applicant: Hitachi, Ltd., Tokyo (JP)

(72) Inventors: Masahiro Masunaga, Tokyo (JP); Shintaroh Sato, Tokyo (JP); Akio Shima, Tokyo (JP); Ryo Kuwana, Tokyo (JP); Isao Hara, Tokyo (JP)

(73) Assignee: HITACHI, LTD., Tokyo (JP)

( * ) Notice: Subject to any disclaimer, the term of this patent is extended or adjusted under 35 U.S.C. 154(b) by 312 days.

(21) Appl. No.: 16/673,017

(22) Filed: Nov. 4, 2019

(65) Prior Publication Data

US 2020/0303505 A1 Sep. 24, 2020

(30) Foreign Application Priority Data

Mar. 20, 2019 (JP) .............................. JP2019-053661

(51) Int. Cl.
*H01L 29/16* (2006.01)
*H01L 27/088* (2006.01)
(Continued)

(52) U.S. Cl.
CPC .... *H01L 29/1608* (2013.01); *H01L 21/28202* (2013.01); *H01L 27/088* (2013.01); *H01L 29/66477* (2013.01); *H01L 29/78* (2013.01)

(58) Field of Classification Search
CPC ......... H01L 21/02378; H01L 21/02529; H01L 21/0445; H01L 21/28202; H01L 27/088;
(Continued)

(56) References Cited

U.S. PATENT DOCUMENTS 4,591,890 A 5/1986 Lund et al.
8,436,367 B1 * 5/2013 Sdrulla ............... H01L 29/1095
257/341

(Continued)

FOREIGN PATENT DOCUMENTS

JP S61-177776 A 8/1986

OTHER PUBLICATIONS

Tianbing Chen, et al., "The effects of NO passivation on the radiation response of SiO2/4H-SiC MOS capacitors", available online at www.sciencedirect.com, Solid-State Electronics 46 (2002) 2231-2235.

(Continued)

*Primary Examiner* — David C Spalla
(74) *Attorney, Agent, or Firm* — Miles & Stockbridge, P.C.

(57) ABSTRACT

An n type semiconductor layer is formed over an n type semiconductor substrate made of silicon carbide, a p type impurity region is formed in the semiconductor layer, and an n type drain region and an n type source region are formed in the impurity region. A field insulating film having an opening that selectively opens a part of the impurity region located between the drain and source regions is formed over the impurity region and the drain and source regions. A gate insulating film is formed over the impurity region in the opening, and a gate electrode is formed on the gate insulating film. Here, a field relaxation layer having an impurity concentration higher than that of the impurity region is formed in at least a part of the impurity region located between the drain and source regions in plan view and located below the field insulating film.

15 Claims, 18 Drawing Sheets

(51) Int. Cl.
*H01L 29/66* (2006.01)
*H01L 29/78* (2006.01)
*H01L 21/28* (2006.01)

(58) Field of Classification Search
CPC ............. H01L 29/0615; H01L 29/0619; H01L 29/1095; H01L 29/1608; H01L 29/66053; H01L 29/66477; H01L 29/78
See application file for complete search history.

(56) References Cited

U.S. PATENT DOCUMENTS

| | | | |
|---|---|---|---|
| 2011/0084324 A1* | 4/2011 | Donnelly | H01L 21/76202 438/297 |
| 2015/0349124 A1* | 12/2015 | Lu | H01L 29/0646 438/105 |
| 2017/0170312 A1 | 6/2017 | Yoo et al. | |
| 2020/0090981 A1* | 3/2020 | Donnelly | H01L 27/092 |

OTHER PUBLICATIONS

Search Report dated Apr. 14, 2020 in European Application No. 19206655.3.
Mohit Bhatnagar et al: "Comparison of 6H-SIC, 3C-SIC, and SI for Power Devices", IEEE Transactions On Electron Devices, Mar. 1993, pp. 645-655, vol. 40, No. 3.

* cited by examiner

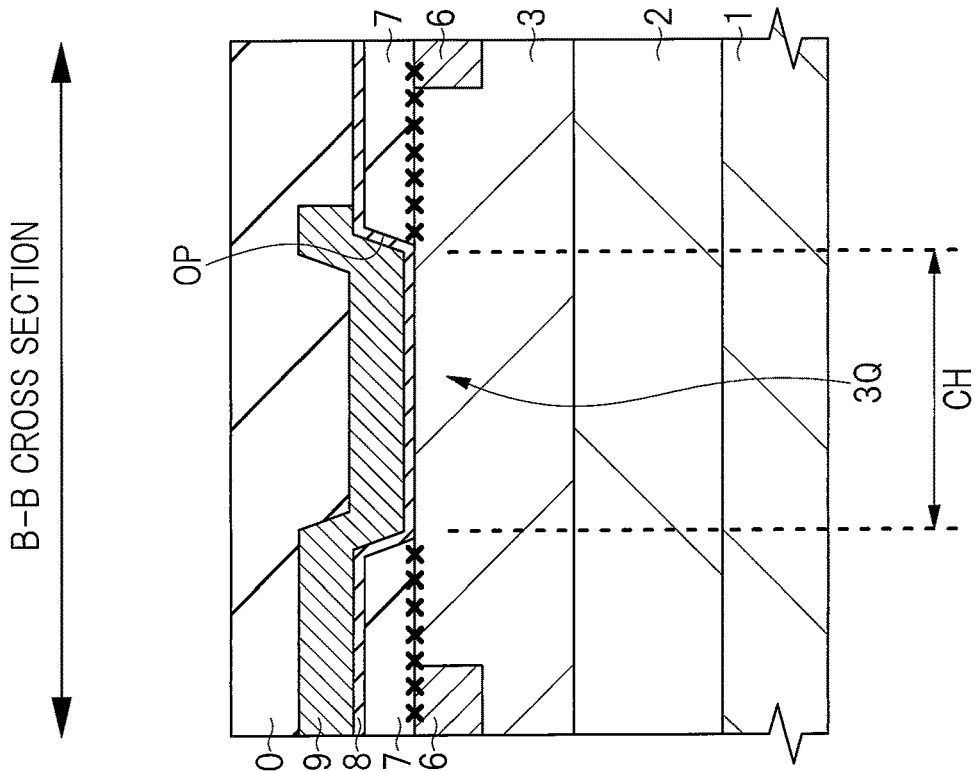
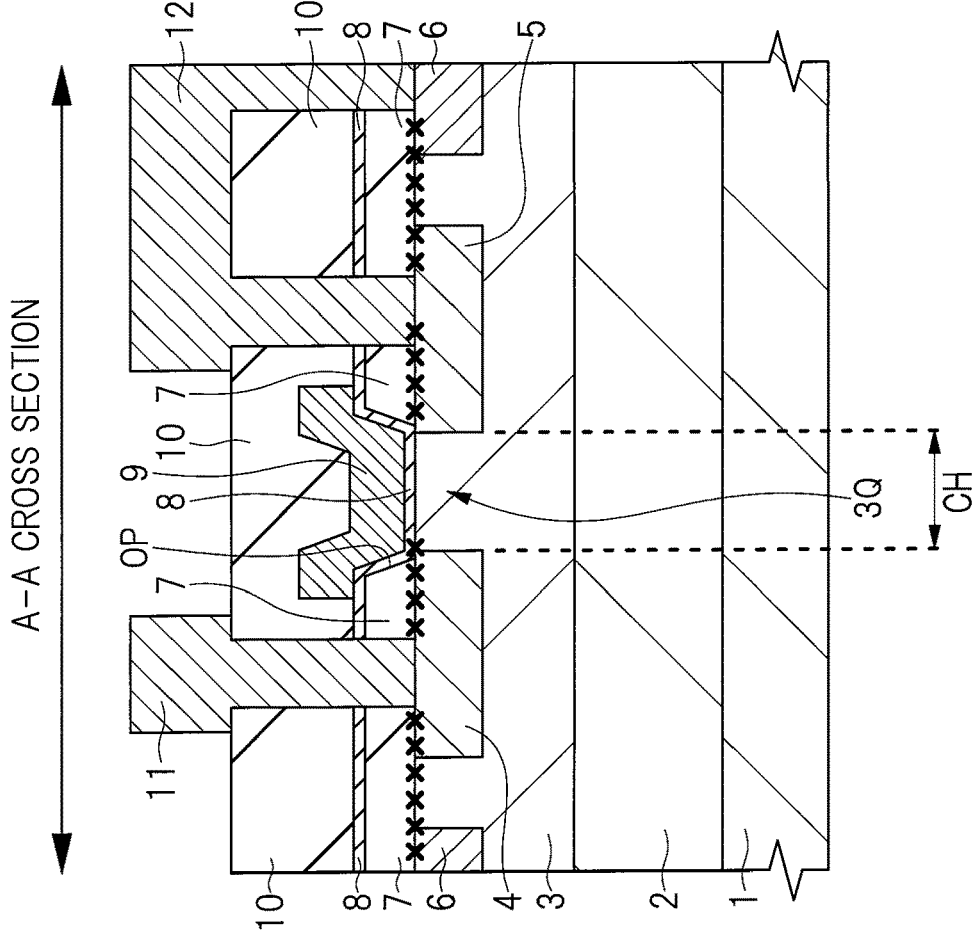
FIG. 22

SEMICONDUCTOR DEVICE, MANUFACTURING METHOD THEREOF, AND PRESSURE TRANSMITTER USING SEMICONDUCTOR DEVICE

CROSS-REFERENCE TO RELATED APPLICATION

The present application claims priority from Japanese Patent Application No. 2019-053661 filed on Mar. 20, 2019, the content of which is hereby incorporated by reference into this application.

TECHNICAL FIELD OF THE INVENTION

The present invention relates to a semiconductor device, a manufacturing method thereof, and a pressure transmitter using a semiconductor device, and particularly relates to a semiconductor device using silicon carbide.

BACKGROUND OF THE INVENTION

Semiconductor devices made of silicon (Si) are used in many industrial products manufactured currently. Meanwhile, in an industrial equipment exposed to a harsh environment such as a high temperature environment or high radiation environment, application of a semiconductor device using a Si substrate is difficult. It is known that silicon carbide (SiC) which is a compound semiconductor is superior to Si in the heat resistance and radiation resistance. Therefore, it is expected that the use of SiC realizes the semiconductor chip capable of operating under the harsh environment.

T. Chen, et al., Solid-State Electronics, vol. 46, no. 12, pp. 2231-2235, December 2002 (Non-Patent Document 1) discloses the technology of performing nitriding treatment at an interface between a silicon carbide layer and a gate oxide film in a semiconductor device using silicon carbide, thereby suppressing the occurrence of defect at the interface.

SUMMARY OF THE INVENTION

For example, as the influences given by radiation to the MISFET (Metal Insulator Semiconductor Field Effect Transistor) using silicon carbide, there are mainly three influences such as the total dose effect, the displacement damage effect, and the single event effect. What is particularly problematic in the influence by the total dose effect is γ rays having a high energy level. The total dose effect is caused by electron-hole pairs generated when energy larger than the bandgap is irradiated to the absorber (semiconductor layer or insulating film).

The electron-hole pairs generated in the semiconductor layer recombine or diffuse if there is no field effect, but the electron-hole pairs generated in the semiconductor layer drift and are taken out of the MISFET as a current if there is a field effect. Therefore, the induced carriers do not remain in the semiconductor layer, and the influence thereof can be almost ignorable.

On the other hand, the electron-hole pairs generated in an insulating film such as a silicon oxide film are affected by the electric field in the insulating film and drift toward a side of lower potential energy. Since holes have lower mobility in comparison with electrons and have higher probability of being trapped at a hole trap center, holes are likely to be accumulated in the insulating film. Since the trapped holes (trapped charge) form a positive charge in the insulating film, the generated space charge field changes the threshold voltage of the MISFET to negative. When a sufficient amount of positive charge is accumulated in the insulating film, the n channel MISFET becomes a depletion MISFET through which a current continues to flow even when 0 V is input to the gate electrode, so that the leakage current is increased.

Moreover, there are other influences due to the electron-hole pairs. The holes induced in the insulating film react with hydrogen present in the insulating film to generate hydrogen radical. The hydrogen radical reacts with hydrogen that terminates the interface between the semiconductor layer and the insulating film, so that a dangling bond is generated at the interface. Since the dangling bond works as an interface defect, problems such as fluctuation in threshold voltage and reduction in mobility occur.

Furthermore, since the interface defect increases the off-leakage current that flows through the interface defect, problems of MISFET parameter failure and deterioration of SN ratio also occur.

Here, it is known that the fluctuation of the threshold voltage due to the trapped charge can be reduced by reducing the thickness of the gate insulating film. On the other hand, the increase of the interface defect is caused by the withdrawal of hydrogen that terminates the interface. Therefore, it is difficult to solve the various problems caused by the interface defect, but the improvement in the reliability of the semiconductor device by suppressing these problems is desired.

Other objects and novel features will be apparent from the description of the present specification and the accompanying drawings.

The following is a brief description of an outline of the typical embodiment disclosed in the present application.

A semiconductor device according to an embodiment includes: a semiconductor substrate of a first conductivity type made of silicon carbide; a semiconductor layer of the first conductivity type formed over the semiconductor substrate; a first impurity region of a second conductivity type opposite to the first conductivity type formed in the semiconductor layer; and a drain region of the first conductivity type and a source region of the first conductivity type formed in the first impurity region. The semiconductor device further includes: a field insulating film formed over the first impurity region, the drain region, and the source region and having an opening that selectively opens a part of the first impurity region located between the drain region and the source region; a gate insulating film formed over the first impurity region in the opening and having a thickness smaller than that of the field insulating film; and a gate electrode formed on the gate insulating film. Here, a field relaxation layer having an impurity concentration higher than that of the first impurity region is formed in at least a part of the first impurity region located between the drain region and the source region in a plan view and located below the field insulating film.

Also, a semiconductor device according to another embodiment includes: a semiconductor substrate of a first conductivity type made of silicon carbide; a semiconductor layer of the first conductivity type formed over the semiconductor substrate; a field relaxation layer of a second conductivity type opposite to the first conductivity type formed in the semiconductor layer; and a drain region of the first conductivity type and a source region of the first conductivity type selectively formed in the field relaxation layer. The semiconductor device further includes: a field insulating film formed over the field relaxation layer, the drain region, and the source region and having an opening that selectively opens apart of the field relaxation layer located between the drain region and the source region; a gate insulating film formed over the field relaxation layer in the opening; and a gate electrode formed on the gate insulating film. Here, an impurity concentration of the field relaxation layer located between the drain region and the source region in plan view is $3.0 \times 10^{17}/cm^3$ or higher.

According to the embodiment, it is possible to improve the reliability of the semiconductor device.

BRIEF DESCRIPTIONS OF THE DRAWINGS

FIG. 22 is a cross-sectional view of the semiconductor device according to the studied example.

DESCRIPTIONS OF THE PREFERRED EMBODIMENTS

Figure 1:
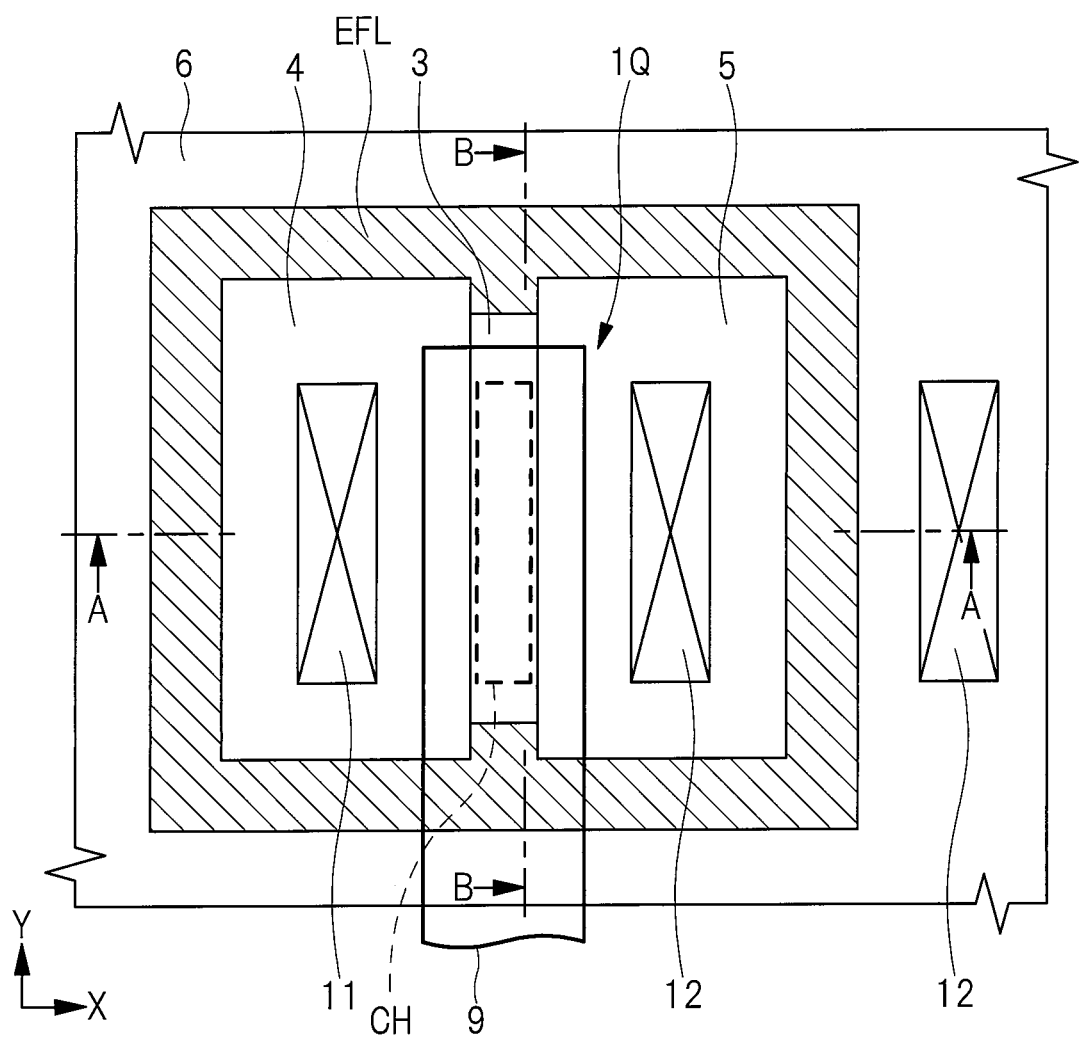
FIG. 1 is a plan view of a semiconductor device according to a first embodiment.

Hereinafter, embodiments of the present invention will be described in detail with reference to the accompanying drawings. Note that the components having the same function are denoted by the same reference characters throughout the drawings for describing the embodiments, and the repetitive description thereof will be omitted. Moreover, in the following embodiments, the descriptions of the same or similar components will not be repeated in principle unless otherwise required.

In addition, in the drawings for describing the embodiments, hatching may be omitted even in a cross-sectional view or applied even in a plan view in some cases in order to make the drawings easy to see.

First Embodiment

Structure of Semiconductor Device According to First Embodiment

Figure 2:
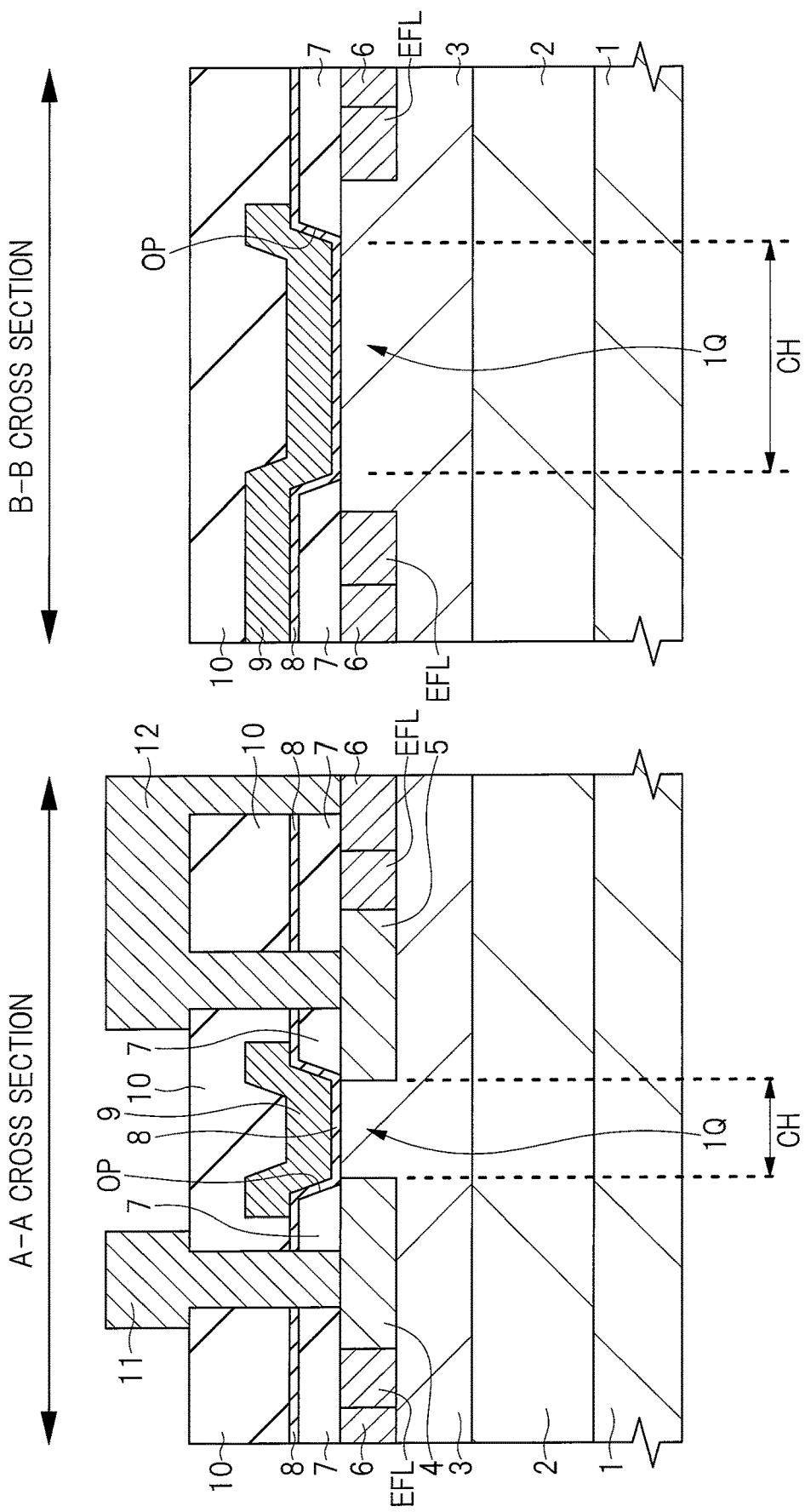
FIG. 2 is a cross-sectional view of the semiconductor device according to the first embodiment.

FIG. 1 and FIG. 2 are a plan view and a cross-sectional view of a semiconductor chip which is a semiconductor device according to the first embodiment, respectively. In the first embodiment, an n type MISFET 1Q is shown as an example of a transistor included in a semiconductor device (semiconductor chip). FIG. 2 shows a cross section taken along a line A-A of FIG. 1 and a cross section taken along a line B-B of FIG. 1. The A-A cross section is a cross section in an X direction and is a cross section in a gate length direction of the MISFET 1Q. Also, the B-B cross section is a cross section in a Y direction and is a cross section in a gate width direction of the MISFET 1Q.

As shown in FIG. 2, a semiconductor substrate (semiconductor layer) 1 used in the first embodiment is a compound semiconductor substrate containing carbon and silicon, specifically, a silicon carbide (SiC) substrate to which n type impurities are introduced. An impurity concentration of the semiconductor substrate 1 is, for example, $1 \times 10^{15}/cm^3$. A semiconductor layer (epitaxial layer) 2 to which n type impurities are introduced is formed over the semiconductor substrate 1. An impurity concentration of the semiconductor layer 2 is, for example, $1 \times 10^{13}/cm^3$ to $1 \times 10^{14}/cm^3$.

An impurity region 3 to which p type impurities are introduced is formed in the semiconductor layer 2. An impurity concentration of the impurity region 3 is, for example, $1 \times 10^{16}/cm^3$ to $3 \times 10^{17}/cm^3$. The impurity region 3 constitutes a part of a channel region of the MISFET 1Q such as an effective channel region CH.

In a region close to a surface of the impurity region 3, a drain region (impurity region) 4 to which n type impurities are introduced, a source region (impurity region) 5 to which n type impurities are introduced, a body region (impurity region) 6 to which p type impurities are introduced, and a field relaxation layer (impurity region) EFL to which p type impurities are introduced are formed in the impurity region 3. An impurity concentration of each of the drain region 4 and the source region 5 is higher than those of the semiconductor substrate 1 and the semiconductor layer 2, and is, for example, $1 \times 10^{20}/cm^3$. An impurity concentration of the body region 6 is higher than that of the impurity region 3, and is, for example, $1 \times 10^{20}/cm^3$.

The drain region 4 constitutes a drain region of the MISFET 1Q, and a power supply voltage (Vdd) is applied thereto. The source region 5 constitutes a source region of the MISFET 1Q, and a reference voltage (Vss) is applied thereto. A part of the impurity region 3 sandwiched between the drain region 4 and the source region 5 serves as the effective channel region CH. The body region 6 is provided mainly for the purpose of reducing a contact resistance between the impurity region 3 and a source electrode 12, and the same reference voltage as that of the source region 5 is applied to the impurity region 3 through the body region 6.

The field relaxation layer EFL is located below a field insulating film 7 in the A-A cross section (X direction) and the B-B cross section (Y direction), and is located between the drain region 4 and the body region 6 and between the source region 5 and the body region 6. In the first embodiment, an impurity concentration of the field relaxation layer EFL is higher than that of the impurity region 3 and is equal to or lower than that of the body region 6. Specifically, the impurity concentration of the field relaxation layer EFL is preferably $1 \times 10^{16}/cm^3$ or higher and more preferably $3 \times 10^{17}/cm^3$ or higher.

The field insulating film (element isolation insulating film) 7 is formed over the impurity region 3 including the drain region 4, the source region 5, the body region 6, and the field relaxation layer EFL. The field insulating film 7 is made of, for example, a silicon oxide film and has a thickness of, for example, about 200 nm to 300 nm. Moreover, as shown in the A-A cross section and the B-B cross section, the field insulating film 7 has an opening OP formed at a position corresponding to the effective channel region CH. In other words, the field insulating film 7 is not formed over the effective channel region CH, and the effective channel region CH is exposed from the field insulating film 7.

A gate insulating film 8 is formed over the impurity region 3 (over the effective channel region CH) in the opening OP and over the field insulating film 7. The gate insulating film 8 is made of, for example, a silicon oxide film and has a thickness of, for example, about 5 nm to 25 nm.

A gate electrode 9 is formed on the gate insulating film 8. The gate electrode 9 is made of, for example, a polycrystalline silicon film to which n type impurities are introduced and has a thickness of, for example, about 100 nm to 200 nm. The gate electrode 9 is formed on the gate insulating film 8 in the opening OP and is formed also over the field insulating film 7 with the gate insulating film 8 interposed therebetween in the X direction and the Y direction. Namely, the gate electrode 9 includes a portion formed over the impurity region 3 with the gate insulating film 8 interposed therebetween and a portion formed over the impurity region 3 with the gate insulating film 8 and the field insulating film 7 interposed therebetween.

Since high electric field is likely to be concentrated around an end portion of the gate electrode 9, the end portion of the gate electrode 9 is provided over the field insulating film 7 with a large thickness so as to suppress the occurrence of the dielectric breakdown. Moreover, in the case where a plurality of MISFETs 1Q are provided on the semiconductor substrate 1, the field insulating film 7 functions also as an element isolation region. Namely, it is possible to prevent the occurrence of a defect such as the false firing caused by the parasitic transistor operated below the gate electrode 9 due to the electric field from the gate electrodes 9 between the plurality of MISFETs 1Q.

Also, since the thickness of the field insulating film 7 is sufficiently larger than that of the gate insulating film 8, a part of the impurity region 3 that functions as the channel region of the MISFET 1Q is the effective channel region CH corresponding to a region where the gate insulating film 8 comes in direct contact with the impurity region 3. In other words, the effective channel region CH is located between the drain region 4 and the source region 5 and is located below the gate electrode 9 with the gate insulating film 8 interposed therebetween. In still other words, since the effective channel region CH is a region overlapped with the opening OP in plan view, it can be said that the effective channel region CH is the impurity region 3 in the opening OP.

An interlayer insulating film 10 made of, for example, a silicon oxide film is formed over the gate electrode 9 and the gate insulating film 8 so as to cover the MISFET 1Q. A plurality of contact holes reaching the drain region 4, the source region 5, and the body region 6 are formed in the interlayer insulating film 10. Also, a drain electrode 11 and a source electrode 12 are formed as a first wiring layer on the interlayer insulating film 10. The drain electrode 11 is a wiring for supplying a power supply voltage and is buried in the contact hole reaching the drain region 4. The source electrode 12 is a wiring for supplying a reference voltage and is buried in the contact holes reaching the source region 5 and the body region 6. Also, the drain electrode 11 and the source electrode 12 are conductive films mainly made of, for example, aluminum. Note that the conductive film may be a single film of an aluminum film or a stacked film including a barrier metal film such as a titanium nitride film and an aluminum film formed on the barrier metal film.

As shown in FIG. 1, the field relaxation layer EFL surrounds the drain region 4 and the source region 5 in plan view, and the body region 6 surrounds the drain region 4 and the source region 5 with the field relaxation layer EFL interposed therebetween in plan view. In other words, the field relaxation layer EFL is provided between the drain region 4 and the body region 6 and between the source region 5 and the body region 6 in plan view. Moreover, a part of the field relaxation layer EFL is provided also between the drain region 4 and the source region 5 in plan view.

Further, the field insulating film 7 is provided over the upper surface of the impurity region 3 except the drain electrode 11, the source electrode 12, and the effective channel region CH (over each upper surface of the drain region 4, the source region 5, the body region 6, and the field relaxation layer EFL) shown in FIG. 1.

The main feature of the semiconductor device including the MISFET 1Q is that the field relaxation layer EFL is formed in at least a part of the impurity region 3 located below the field insulating film 7 and located between the drain region 4 and the source region 5 in plan view. Before describing the effect of the feature, the knowledge of the inventors of the present application and a semiconductor device according to a studied example based on the knowledge will be described.

Knowledge of Inventors of Present Application and Semiconductor Device According to Studied Example Hereinafter, the knowledge of the inventors of the present application will be described with reference to FIG. 17 to FIG. 20, and the semiconductor device according to the studied example will be described with reference to FIG. 21 and FIG. 22.

Figure 17:
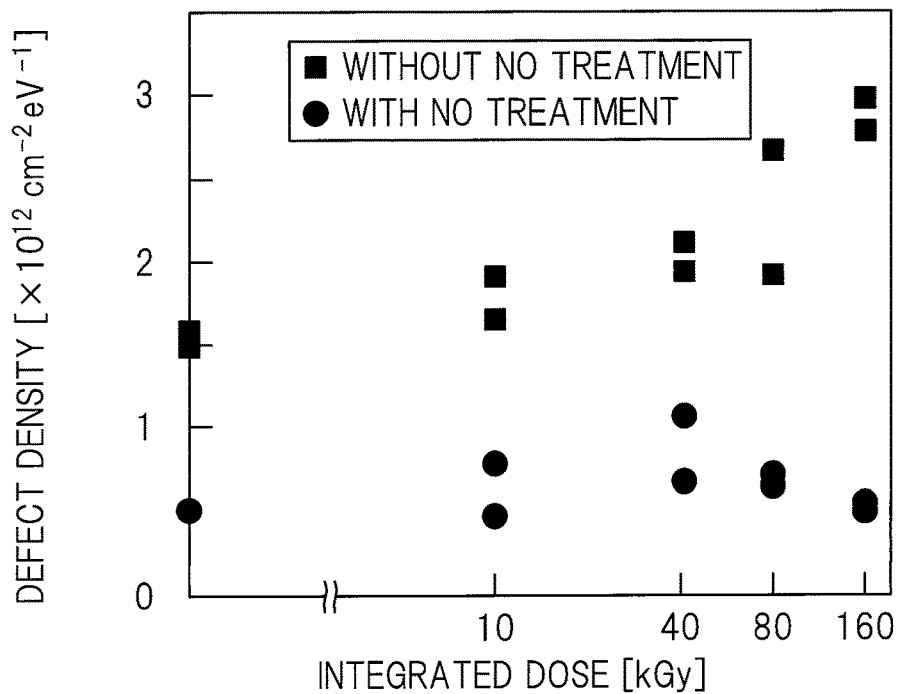
FIG. 17 is a graph created by the inventors of the present application based on the Non-Patent Document 1.

FIG. 17 is a graph created by the inventors of the present application based on the contents disclosed in the Non-Patent Document 1 mentioned above, and is the measurement data showing the relationship between the defect density at the interface between the gate insulating film and the semiconductor layer (SiC layer) and the integrated dose by γ rays in the MOS capacitor using the SiC substrate.

It can be seen that the defect density increases by the irradiation of γ rays in the sample in which the oxynitriding treatment (NO annealing) is not performed to the gate insulating film (■). Meanwhile, it can be seen that the defect density scarcely increases and is stable in the sample in which the oxynitriding treatment (NO annealing) is performed to the gate insulating film (●) even when γ rays are irradiated up to 160 kGy. Accordingly, it is expected that the radiation resistance against γ rays can be improved by adopting the thin gate insulating film to which the oxynitriding treatment is performed in the MISFET using the SiC substrate.

However, the studies by the inventors of the present application have revealed that even if the MISFETs in which the oxynitriding treatment is performed to the above-mentioned interface are designed based on the conventional design concept and are integrated, these are insufficient for the improvement of the radiation resistance.

Figure 18:
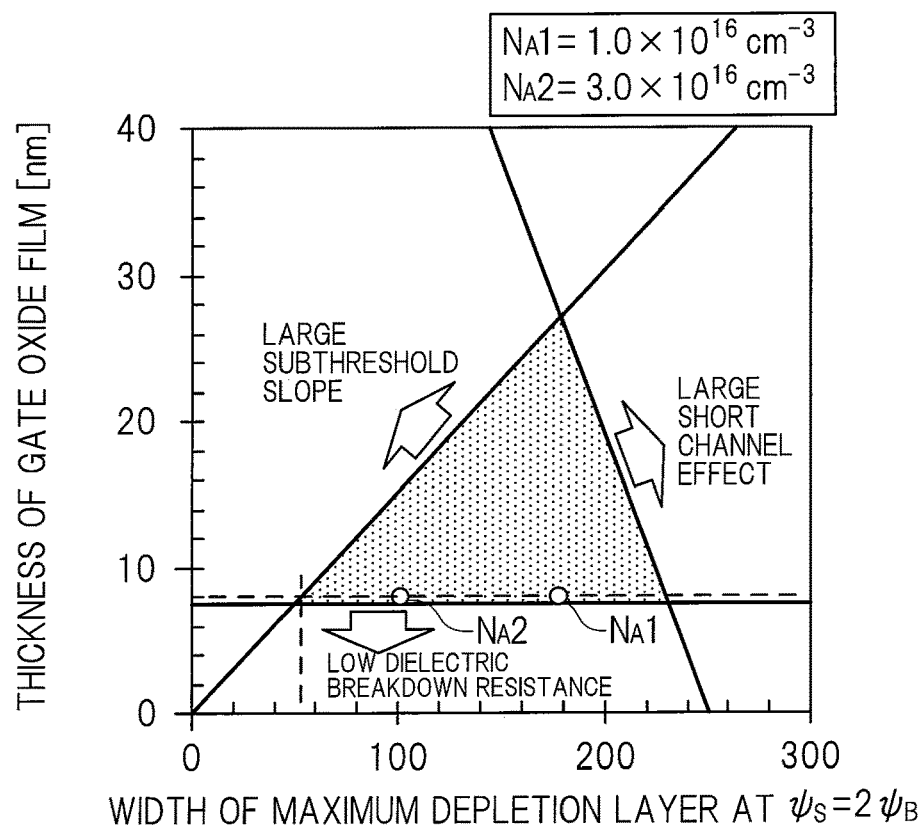
FIG. 18 is a correlation diagram of various parameters in CMOS design.

FIG. 18 is a correlation diagram of various parameters in CMOS design, and shows a relationship between the thickness of the gate insulating film and the width of the maximum depletion layer in the case where the surface potential ($\psi_S$) is equal to $2\psi_B$. The CMOS design is determined by the restrictions of the short channel effect, the breakdown resistance of the insulating film, and the subthreshold slope. Note that $\psi_B$ is the difference between the Fermi level (Ef) of the current semiconductor and the Fermi level (Ei) of the intrinsic semiconductor, and the charge in the inversion layer increases rapidly when $\psi_S$ exceeds $2\psi_B$.

As shown in FIG. 18, the short channel effect is improved by reducing the width of the maximum depletion layer, but the characteristic of the subthreshold slope is deteriorated. For example, the driving current increases by reducing the thickness of the gate insulating film, but the breakdown resistance of the insulating film is lowered and the reliability of the MISFET is decreased. Therefore, the hatched region in FIG. 18 corresponds to the region where these restrictions are simultaneously satisfied and is considered as a suitable design range.

The inventors of the present application designed an operational amplifier using the SiC-MISFET designed based on the design range considered as a suitable range in FIG. 18. Here, the thickness of the gate insulating film was set to 8 nm, and two samples having the acceptor concentration $N_A$ which was the impurity concentration of the channel region of $1.0 \times 10^{16}/cm^3$ (◆) and $3.0 \times 10^{16}/cm^3$ (◇) were prepared.

Figure 19:
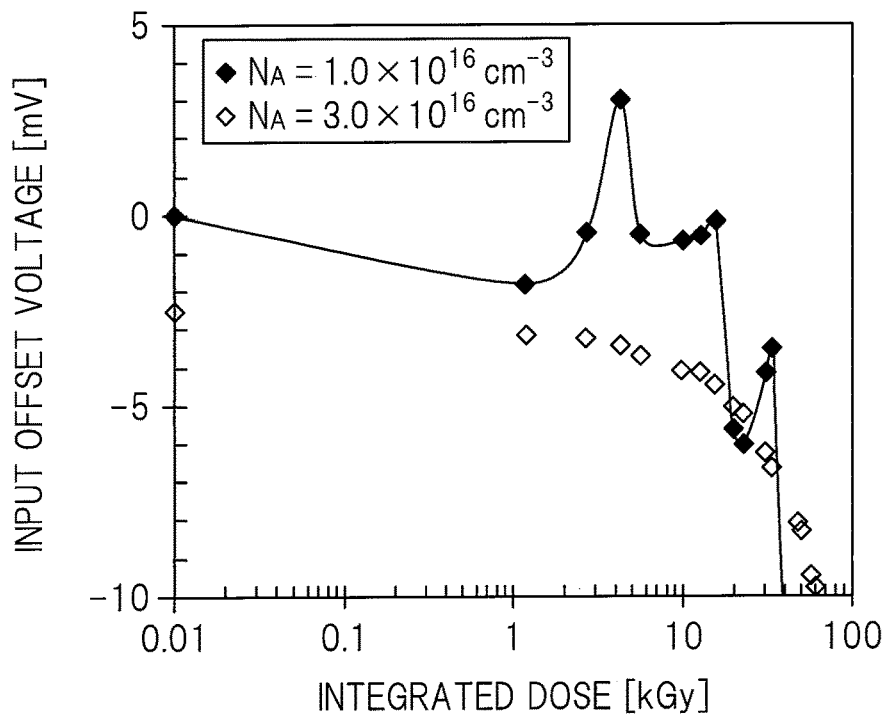
FIG. 19 is a graph showing measurement results by the inventors of the present application.

FIG. 19 is a graph showing measurement results by the inventors of the present application, and shows a relationship between the input offset voltage of the operation amplifier and the integrated dose of γ rays. The input offset voltage showed the tendency that it decreased as the integrated dose of γ rays increased, and the acceptor concentration $N_A$ showed the tendency that the radiation resistance was lowered as the concentration becomes lower. For example, the operation of the operational amplifier became unstable when the integrated dose exceeded 3 kGy in the case of $1.0 \times 10^{16}/cm^3$ (◆) and when the integrated dose exceeded 20 kGy in the case of $3.0 \times 10^{16}/cm^3$ (◇). Although it was expected that the increase of the interface defect was suppressed until the integrated dose of γ rays reached around 160 kGy with reference to FIG. 17, the result was lower than expected by about one order of magnitude.

Figure 20:
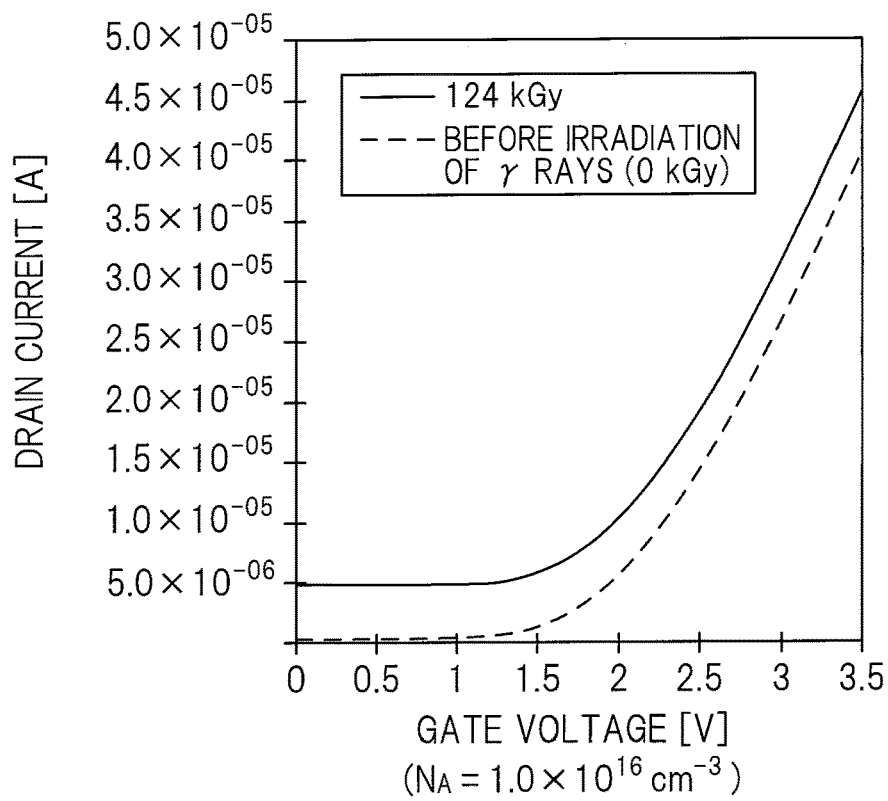
FIG. 20 is a graph showing measurement results by the inventors of the present application.

FIG. 20 is a graph showing measurement results by the inventors of the present application, and shows a relationship between the drain current and the gate voltage in the n type MISFET. In the graph after the irradiation of γ rays up to 124 kGy, the change of about 5.0 uA was observed in comparison with the graph before the irradiation of γ rays (0 kGy). Namely, it could be seen that the leakage current of about 5.0 uA was generated. Since the idling current of the operational amplifier is several uA order, the leakage current of about 5.0 uA is unignorable. Although the case where the acceptor concentration $N_A$ is $1.0 \times 10^{16}/cm^3$ is shown as an example here, the same tendency was observed at other concentrations (for example, $3.0 \times 10^{16}/cm^3$ or higher).

Moreover, when the drain current before the irradiation and the drain current after the irradiation were compared, the slope of the drain current was substantially the same in the region after the drain current rose (region where the gate voltage became higher than about 1.5 V). Namely, even though the leakage current increased, the influence of the interface defect was not observed.

From these results, it is considered that the interface defect due to γ rays affects the leakage current in the case where the MISFET is in an off state, rather than the case where the MISFET is in an on state. In other words, it is presumed that the interface defect due to γ rays generates the leakage current in the region other than the channel region in which the oxynitriding treatment is performed.

Figure 21:
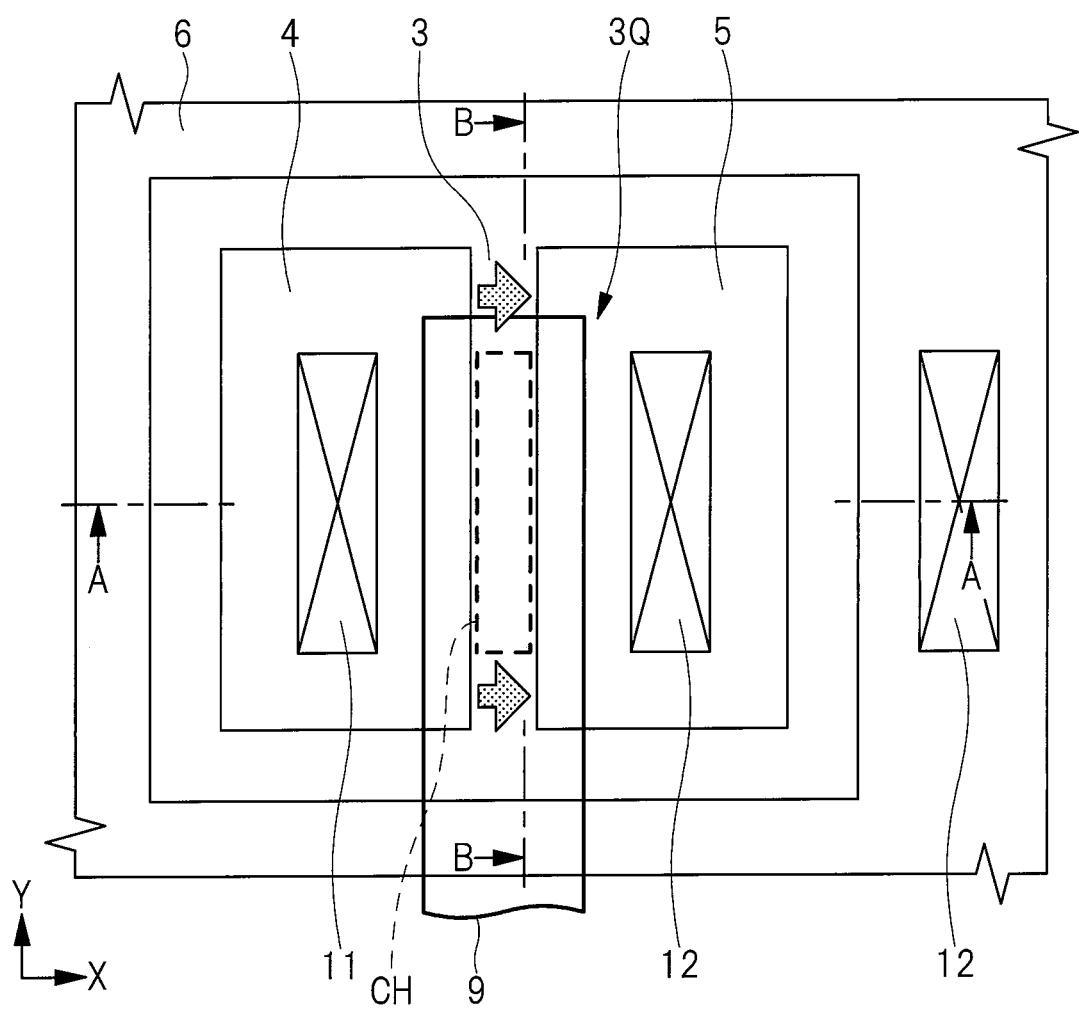
FIG. 21 is a plan view of a semiconductor device according to a studied example.

FIG. 21 and FIG. 22 are a plan view and a cross-sectional view of a MISFET 3Q which is a semiconductor device according to the studied example. The MISFET 3Q has substantially the same configuration as the MISFET 1Q according to the first embodiment, but is different from the MISFET 1Q in that the field relaxation layer EFL is not provided. Note that the path of the leakage current described later is indicated by hatched arrows in FIG. 21 and the interface defects described later are indicated by a plurality of x marks in FIG. 22.

As disclosed in the problem of the present application above, there are the problem of the fluctuation of the threshold voltage of the MISFET caused by the holes trapped in the insulating film due to γ rays and the problem of the occurrence of the defect at the interface between the semiconductor layer and the insulating film.

In the MISFET 3Q according to the studied example, the fluctuation of the threshold voltage is suppressed by reducing the thickness of the gate insulating film 8 and the influence of the trapped charge and the interface defect is suppressed by performing the oxynitriding treatment described with reference to FIG. 17 to the gate insulating film 8. Therefore, in the MISFET 3Q according to the studied example, the slope of the drain current after the drain current rises scarcely changes as shown in FIG. 20.

However, since the field insulating film 7 formed outside the effective channel region CH has the thickness about ten times or more larger than that of the gate insulating film 8, the nitridation is difficult at the interface between the field insulating film 7 and the impurity region 3. Namely, even when the same oxynitriding treatment as that to the gate insulating film 8 having a relatively smaller thickness is performed to the field insulating film 7, the same nitridation as that of the gate insulating film 8 in the effective channel region CH is not generated.

Further, since the field insulating film 7 has a large thickness, there is the problem that the generation amount of the electron-hole pairs due to γ rays is large and the interface defect is likely to be induced. Therefore, a large number of defects are likely to be induced at the interface between the field insulating film 7 and the impurity region 3, and there is high possibility that the path of the leakage current is formed here. Namely, a large number of interface defects due to γ rays are generated at the interface between the impurity region 3 other than the effective channel region CH and the field insulating film 7.

Therefore, as described with reference to FIG. 20, even when the MISFET is in an off state and no current flows in the effective channel region CH, the leakage current is likely to flow in the impurity region 3 other than the effective channel region CH. Note that the leakage current and the interface defect are almost similarly generated in any cases regardless of whether the gate electrode 9 is formed over the impurity region 3 as shown in the B-B cross section of FIG. 21 and FIG. 22.

Main Feature of Semiconductor Device According to First Embodiment

The MISFET Q1 according to the first embodiment has been devised in consideration of the various problems in the studied example.

In the MISFET 1Q, the fluctuation of the threshold voltage is suppressed by reducing the thickness of the gate insulating film 8 to 5 nm to 25 nm in the same manner as the MISFET 3Q according to the studied example. Moreover, the interface between the gate insulating film 8 and the impurity region 3 (effective channel region CH) is nitrided by performing the oxynitriding treatment to the gate insulating film 8, and the influence of the trapped charge and the interface defect is suppressed.

Further, in the first embodiment, the field relaxation layer EFL having an impurity concentration higher than that of the impurity region 3 is formed in at least a part of the impurity region 3 located between the drain region 4 and the source region 5 in plan view and located below the field insulating film 7. This time, the leakage current induced by γ rays is considered as band-to-band tunneling current, and this depends on the interface defect and the field intensity. In the first embodiment, instead of reducing the density of the interface defects induced below the field insulating film 7, the field intensity relating to the interface defect is reduced by the field relaxation layer EFL, thereby preventing the reduction of the barrier height of the trapped charge. In other words, the emission of the trapped charge is suppressed by the field relaxation layer EFL.

Therefore, even when the MISFET 1Q using the SiC substrate is exposed to the radiation environment including γ rays and the interface defect is generated below the field insulating film 7, the leakage current is suppressed. Accordingly, it is possible to improve the reliability of the semiconductor device.

Figure 3:
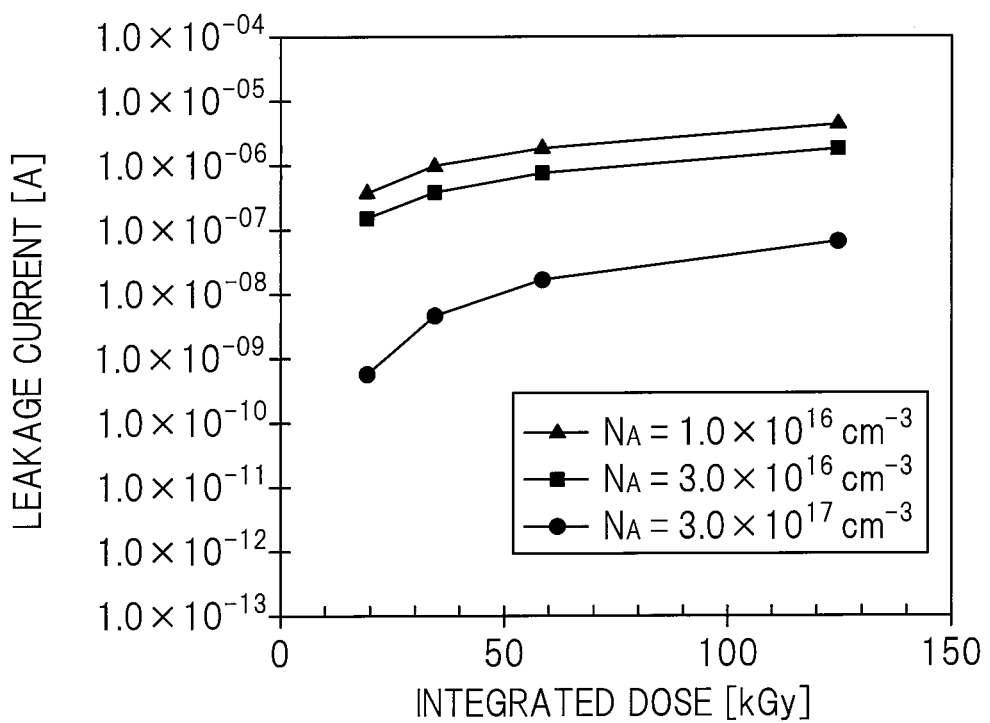
FIG. 3 is a graph showing measurement results by the inventors of the present application.
Figure 4:
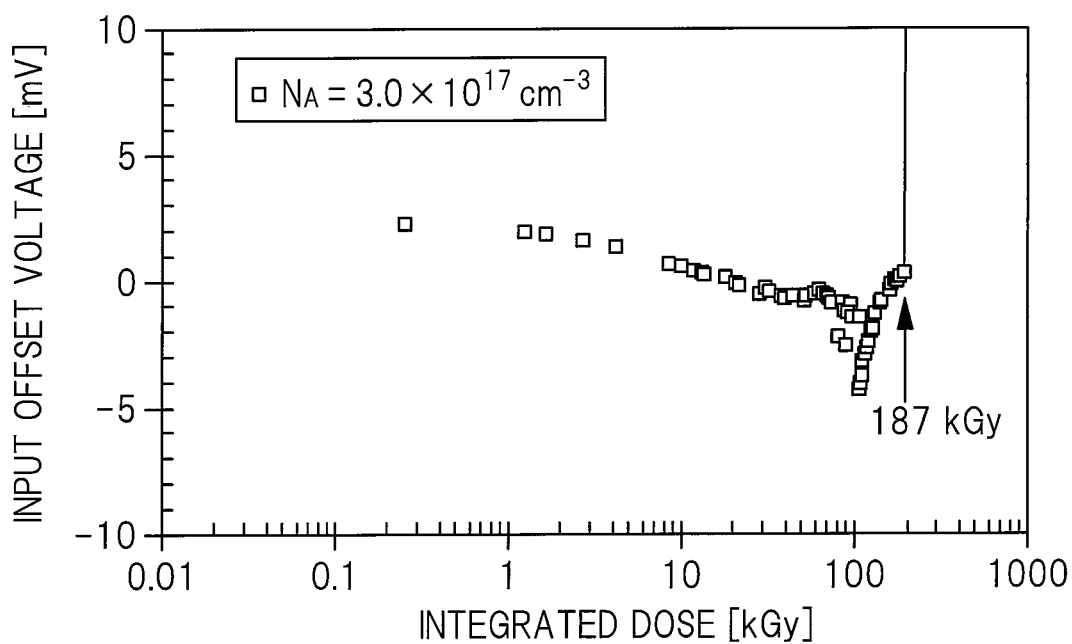
FIG. 4 is a graph showing measurement results by the inventors of the present application.

Moreover, in the first embodiment, the impurity concentration of the field relaxation layer EFL is preferably $1\times10^{16}/cm^3$ or higher and more preferably $3\times10^{17}/cm^3$ or higher. Thus, the leakage current is more effectively suppressed. Hereinafter, the reasons therefor will be described with reference to FIG. 3 and FIG. 4. FIG. 3 and FIG. 4 are graphs showing measurement results by the inventors of the present application.

FIG. 3 shows a relationship between the leakage current and the integrated dose of γ rays in the n type MISFET 1Q. In FIG. 3, evaluation results in the cases where the acceptor concentration $N_A$ which is the impurity concentration of the field relaxation layer is $1.0\times10^{16}/cm^3$ (▲), $3.0\times10^{16}/cm^3$ (■), and $3.0\times10^{17}/cm^3$ (●) are shown. For example, when comparing the leakage current in the case where the integrated dose of γ rays is about 140 kGy, it can be seen that the leakage current in the case where the acceptor concentration $N_A$ is $3.0\times10^{17}/cm^3$ (●) is lower than those of other samples by one or more orders of magnitude.

FIG. 4 shows a relationship between the input offset voltage of the operational amplifier fabricated using the MISFET 1Q and the integrated dose of γ rays in the case where the acceptor concentration $N_A$ is $3.0\times10^{17}/cm^3$. As shown in FIG. 4, the input offset voltage changes stably until the integrated dose of γ rays reaches about 187 kGy, and it can be seen that the operational amplifier operates stably. Therefore, it can be seen that the operational amplifier fabricated using the MISFET 1Q has sufficient radiation resistance.

Manufacturing Method of Semiconductor Device According to First Embodiment

Hereinafter, the manufacturing method of the semiconductor device according to the first embodiment will be described with reference to FIG. 5 to FIG. 8.

Figure 5:
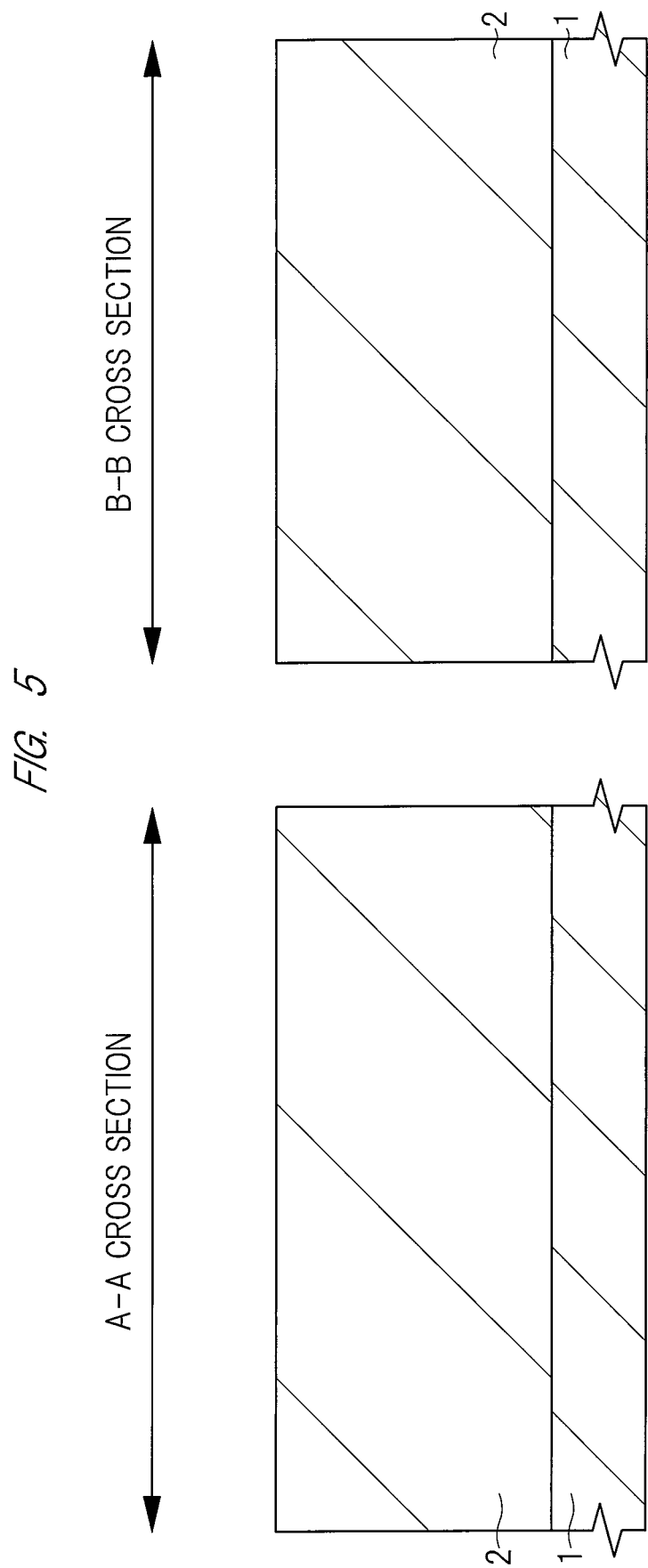
FIG. 5 is a cross-sectional view showing a manufacturing process of the semiconductor device according to the first embodiment.

First, as shown in FIG. 5, the semiconductor substrate 1 having a front surface and a back surface which is a surface opposite to the front surface is prepared. The semiconductor substrate 1 is a compound semiconductor substrate containing carbon and silicon, specifically, a silicon carbide (SiC) substrate to which n type impurities are introduced.

Next, the n type semiconductor layer 2 is formed by the epitaxial growth method over the front surface of the semiconductor substrate 1. The semiconductor layer 2 can be made to be an n type by introducing, for example, nitrogen ($N_2$) gas as the gas used in the epitaxial growth method, and the impurity concentration of the semiconductor layer 2 can be set to a desired concentration by adjusting the amount of nitrogen to be introduced.

Figure 6:
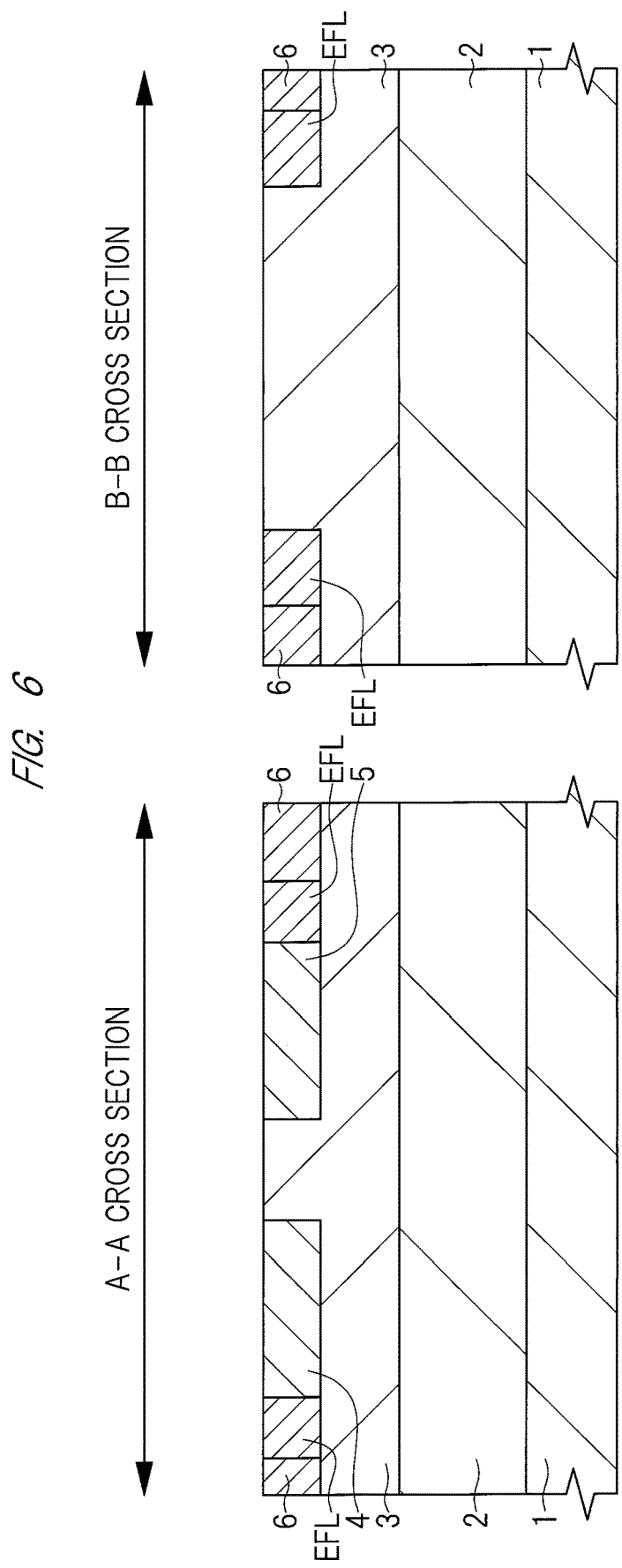
FIG. 6 is a cross-sectional view showing the manufacturing process continued from FIG. 5.

FIG. 6 shows the forming process of the impurity region 3, the drain region 4, the source region 5, the body region 6, and the field relaxation layer EFL.

First, the p type impurity region 3 is formed in the semiconductor layer 2 by the photolithography technique and the ion implantation method. Next, the n type drain region 4 and the n type source region 5 are selectively formed in the impurity region 3 by the photolithography technique and the ion implantation method. The impurity concentration of each of the drain region 4 and the source region 5 is higher than those of the semiconductor substrate 1 and the semiconductor layer 2, and is, for example, $1\times10^{20}/cm^3$.

Next, the p type field relaxation layer EFL is selectively formed in the impurity region 3 so as to surround the drain region 4 and the source region 5 in plan view by the photolithography technique and the ion implantation method. Moreover, the field relaxation layer EFL is formed also in the impurity region 3 located between the drain region 4 and the source region 5 in plan view. The impurity concentration of the field relaxation layer EFL is higher than that of the impurity region 3, and is preferably $1\times10^{16}/cm^3$ or higher and more preferably $3\times10^{17}/cm^3$ or higher.

Next, the p type body region 6 is selectively formed in the impurity region 3 so as to surround the drain region 4 and the source region 5 with the field relaxation layer EFL interposed therebetween in plan view by the photolithography technique and the ion implantation method. The impurity concentration of the body region 6 is higher than that of the impurity region 3, and is, for example, $1\times10^{20}/cm^3$.

For example, nitrogen is used as ions for forming the n type impurity region, and aluminum is used as ions for forming the p type impurity region. Also, in the first embodiment, the forming process of the drain region 4 and the source region 5, the forming process of the body region 6, and the forming process of the field relaxation layer EFL are performed in respectively separate processes, and are performed using respectively different masks. Moreover, the order of these processes is not particularly limited.

After these ion implantations, the high temperature annealing treatment at, for example, 1600° C. or higher is performed to activate the impurities contained in the impurity region 3, the drain region 4, the source region 5, the body region 6, and the field relaxation layer EFL.

Figure 7:
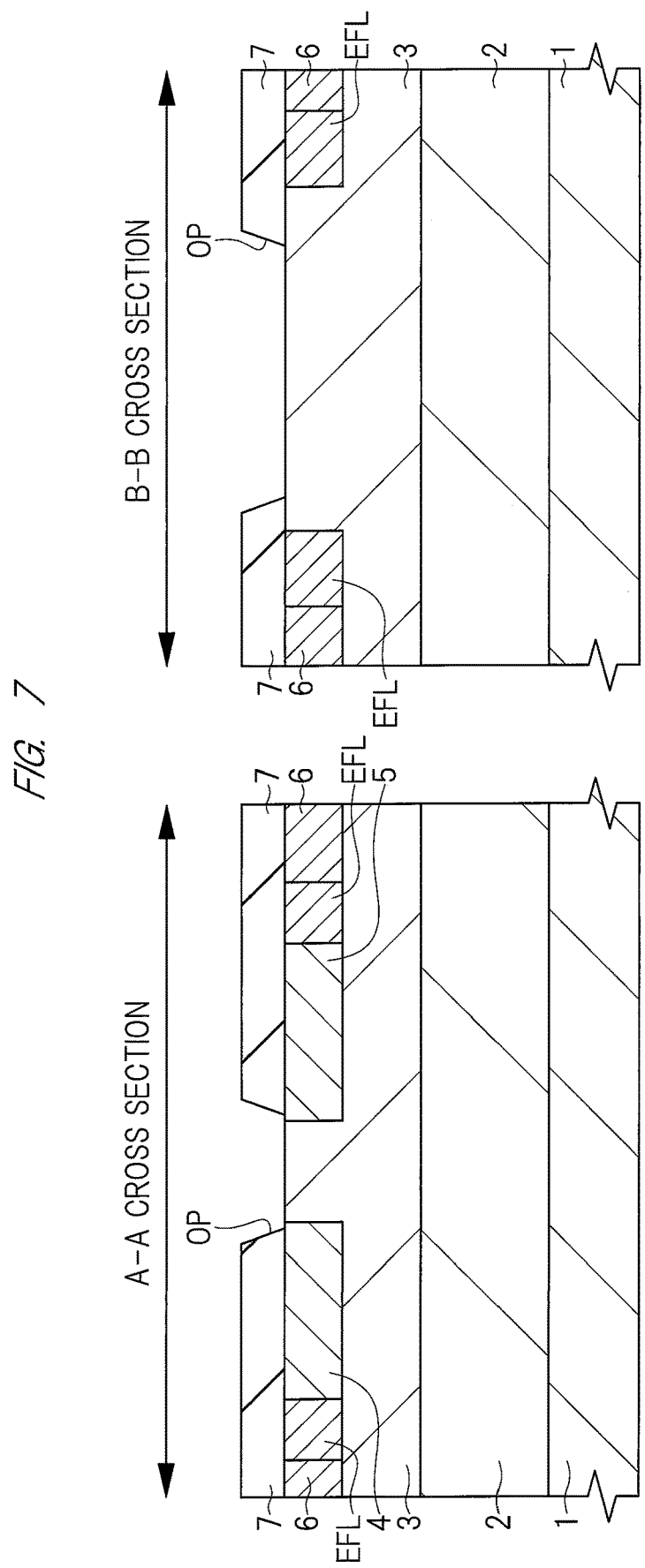
FIG. 7 is a cross-sectional view showing the manufacturing process continued from FIG. 6.

FIG. 7 shows a forming process of the field insulating film 7 and the opening OP.

First, the field insulating film 7 made of, for example, silicon oxide is formed over the impurity region 3 by, for example, the CVD (Chemical Vapor Deposition) method. Next, the opening OP is formed in the field insulating film 7 so as to selectively open a part of the impurity region 3 located between the drain region 4 and the source region 5 by the photolithography technique and the wet etching treatment. The region which is not covered with the field insulating film 7 and is exposed from the field insulating film 7 through the opening OP serves as the effective channel region CH described later.

Figure 8:
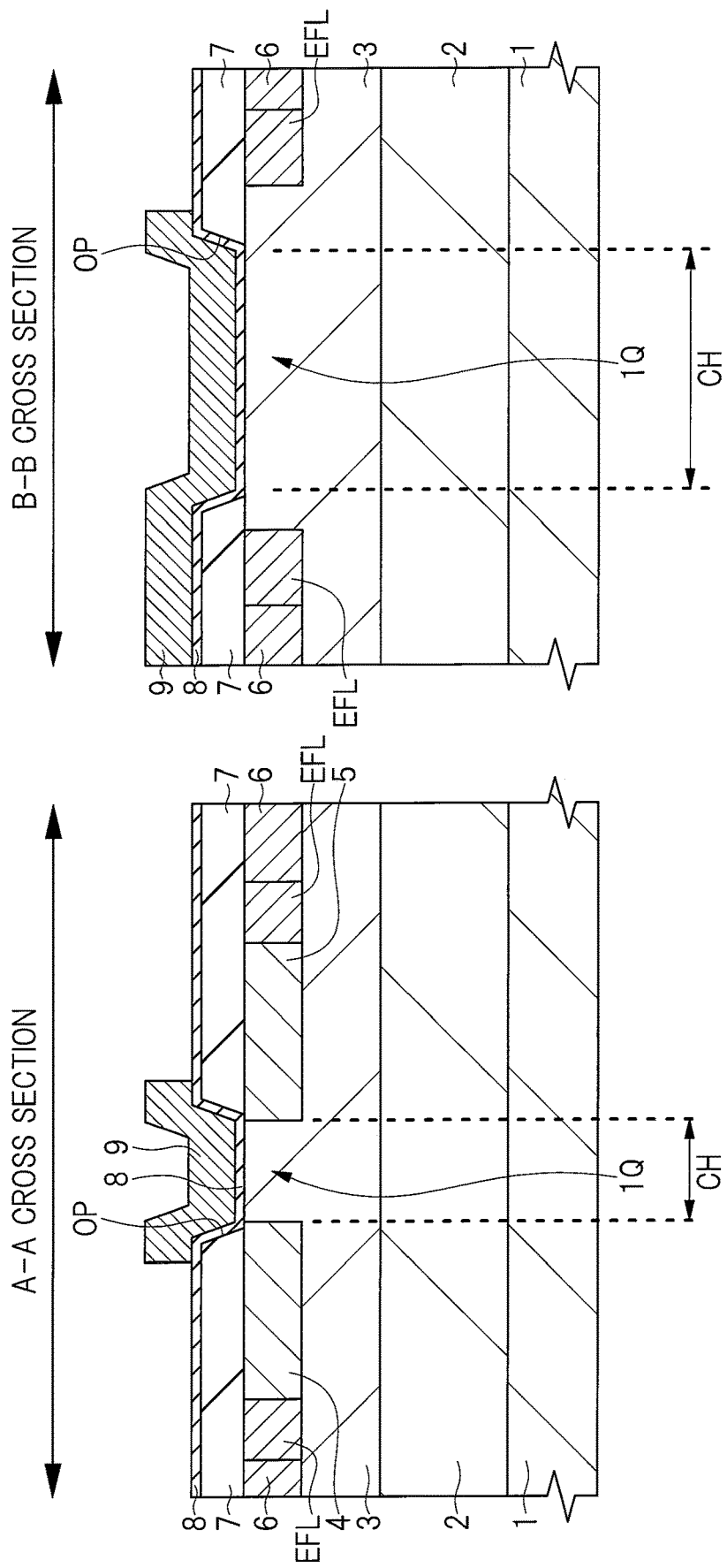
FIG. 8 is a cross-sectional view showing the manufacturing process continued from FIG. 7.

FIG. 8 shows a forming process of the gate insulating film 8 and the gate electrode 9.

First, the gate insulating film 8 made of, for example, silicon oxide is formed over the impurity region 3 in the opening OP and the field insulating film 7 by, for example, the CVD method. Next, a conductive film such as a polycrystalline silicon film is formed over the gate insulating film 8 by, for example, the CVD method. Then, the conductive film is selectively patterned by the photolithography technique and the etching method, thereby forming the gate electrode 9 made of the conductive film. The region where the gate insulating film 8 is directly formed on the impurity region 3 serves as the effective channel region CH.

Next, the oxynitriding treatment (NO treatment) is performed to the semiconductor substrate 1. For example, the oxynitriding treatment is performed under the conditions of the temperature range of 1300° C. to 1400° C. and 15 minutes. Consequently, the interface between the gate insulating film 8 and the impurity region 3 (effective channel region CH) is nitrided. As described above, the nitridation is easily promoted at the interface between the gate insulating film 8 and the effective channel region CH, but the nitridation is difficult to be performed at the interface between the field insulating film 7 and the impurity region 3 (field relaxation layer EFL). However, in the first embodiment, the field relaxation layer EFL is formed in the region where the nitridation is difficult to be performed. In the manner described above, the n type MISFET 1Q is formed.

Thereafter, the structure shown in FIG. 2 is obtained by forming the interlayer insulating film 10, the drain electrode 11, and the source electrode 12.

First, the interlayer insulating film 10 made of, for example, silicon oxide is formed so as to cover the MISFET 1Q by, for example, the CVD method. Next, a plurality of contact holes are formed in the interlayer insulating film 10 by the photolithography technique and the dry etching treatment. These contact holes are formed so as to reach the drain region 4, the source region 5, and the body region 6. Next, a conductive film mainly made of, for example, aluminum is formed over the interlayer insulating film 10 so as to fill the plurality of contact holes by, for example, the sputtering method. This conductive film may be a single film of an aluminum film or a stacked film including a barrier metal film such as a titanium nitride film and an aluminum film formed on the barrier metal film. Next, the conductive film is patterned by the photolithography technique and the dry etching treatment, thereby forming the drain electrode 11 and the source electrode 12.

In the manner described above, the semiconductor device according to the first embodiment is manufactured.

Second Embodiment

A semiconductor device according to the second embodiment will be described below with reference to FIG. 9 and FIG. 10. Note that the difference between the first embodiment and the second embodiment will be mainly described in the following description.

In the first embodiment, the field relaxation layer EFL is formed in at least a part of the impurity region 3 located below the field insulating film 7.

Figure 9:
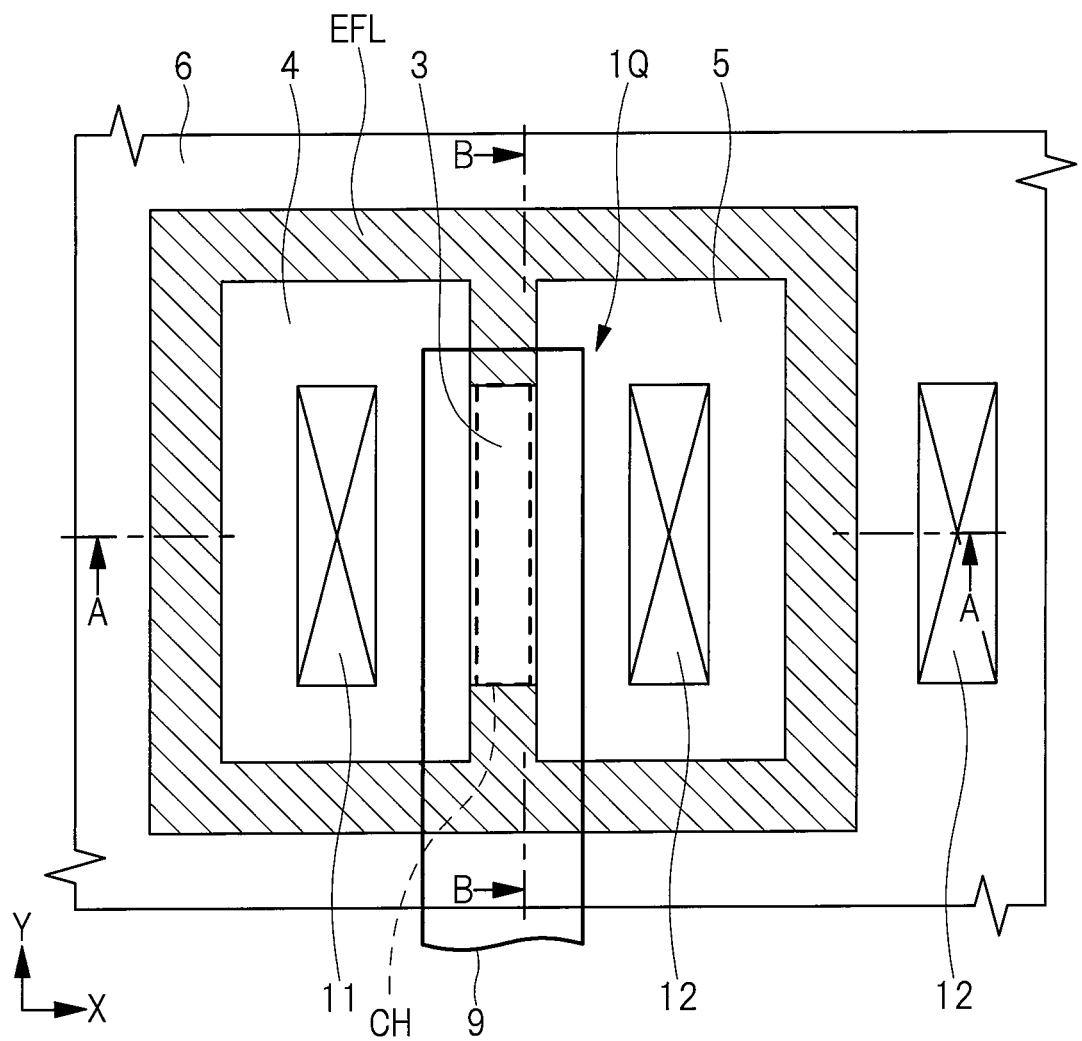
FIG. 9 is a plan view of a semiconductor device according to a second embodiment.
Figure 10:
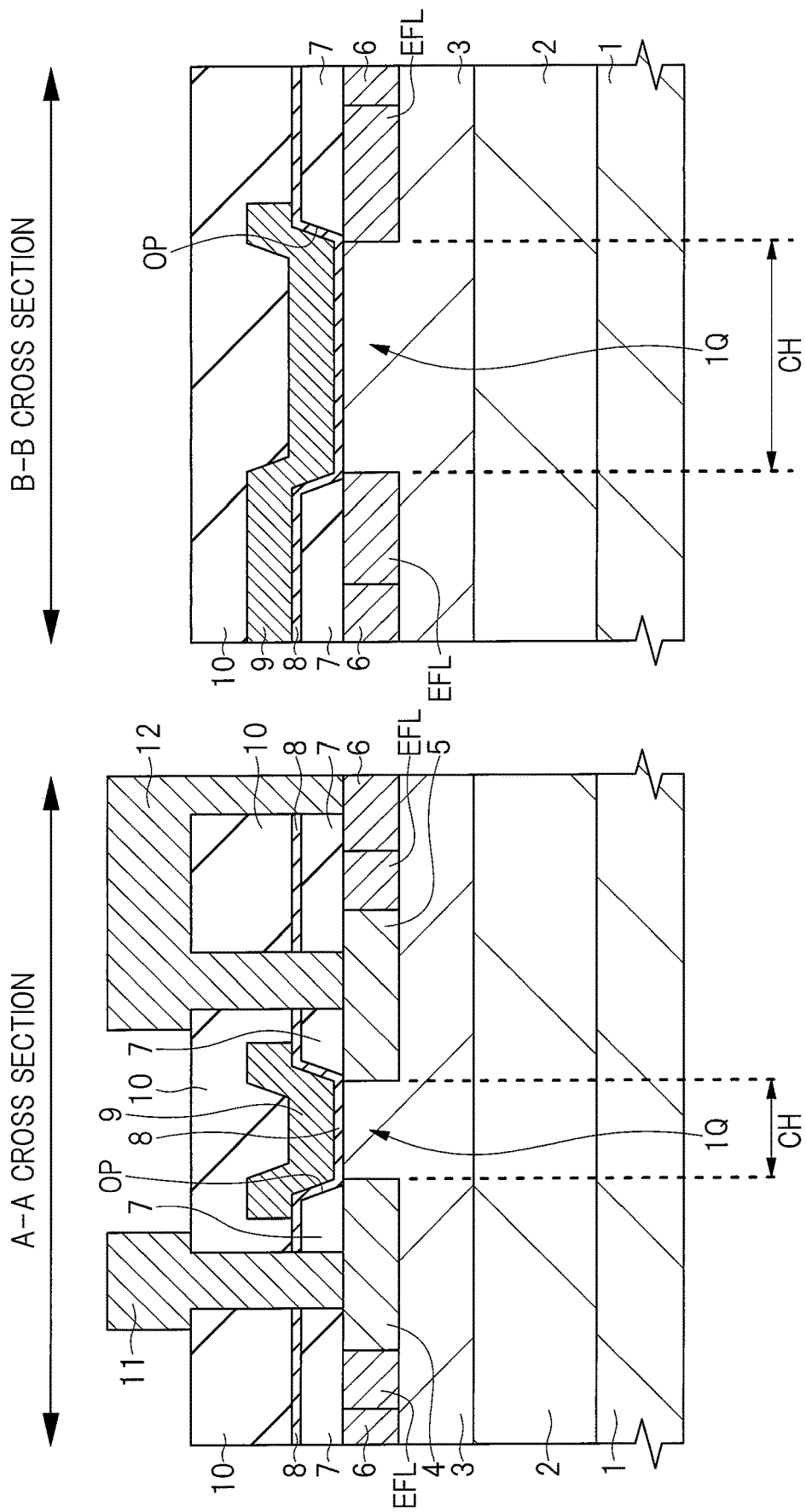
FIG. 10 is a cross-sectional view of the semiconductor device according to the second embodiment.

In the second embodiment, as shown in FIG. 9 and the B-B cross section of FIG. 10, the field relaxation layer EFL is formed in the whole of the impurity region 3 located between the drain region 4 and the source region 5 in plan view and located below the field insulating film 7. Namely, the field relaxation layer EFL is formed so as to reach the position in contact with the effective channel region CH in the gate width direction (Y direction). Consequently, the leakage current caused by the interface defect present below the field insulating film 7 can be further suppressed.

The field relaxation layer EFL is formed by the ion implantation as described above with reference to FIG. 6, and the impurities contained in the field relaxation layer EFL are activated by the high temperature annealing performed afterward. Here, since the impurity diffusion coefficient is low in semiconductor such as SiC, the impurities are less likely to be diffused in the lateral direction by the high temperature annealing. In other words, the position of the impurity region is substantially determined at the time of the ion implantation, and it is difficult to move the position of the impurity region by the high temperature annealing treatment.

Accordingly, even when the field relaxation layer EFL is formed so as to reach the position in contact with the effective channel region CH by the ion implantation, the defect that the field relaxation layer EFL is diffused to the inside of the effective channel region CH by the high temperature annealing and the width of the effective channel region CH is narrowed is suppressed. Therefore, the leakage current caused by the interface defect can be suppressed while suppressing the reduction of the drain current caused by narrowing the width of the effective channel region CH.

Third Embodiment

A semiconductor device according to the third embodiment will be described below with reference to FIG. 11 and FIG. 12. Note that the difference between the first embodiment and the third embodiment will be mainly described in the following description.

In the first embodiment, the impurity region 3 and the field relaxation layer EFL are formed individually to have different impurity concentrations. By designing the MISFET 1Q in this manner, the degree of freedom in the design of the MISFET 1Q can be enhanced while achieving both of the performance required for the transistor and the reduction of the leakage current caused by the interface defect.

Figure 11:
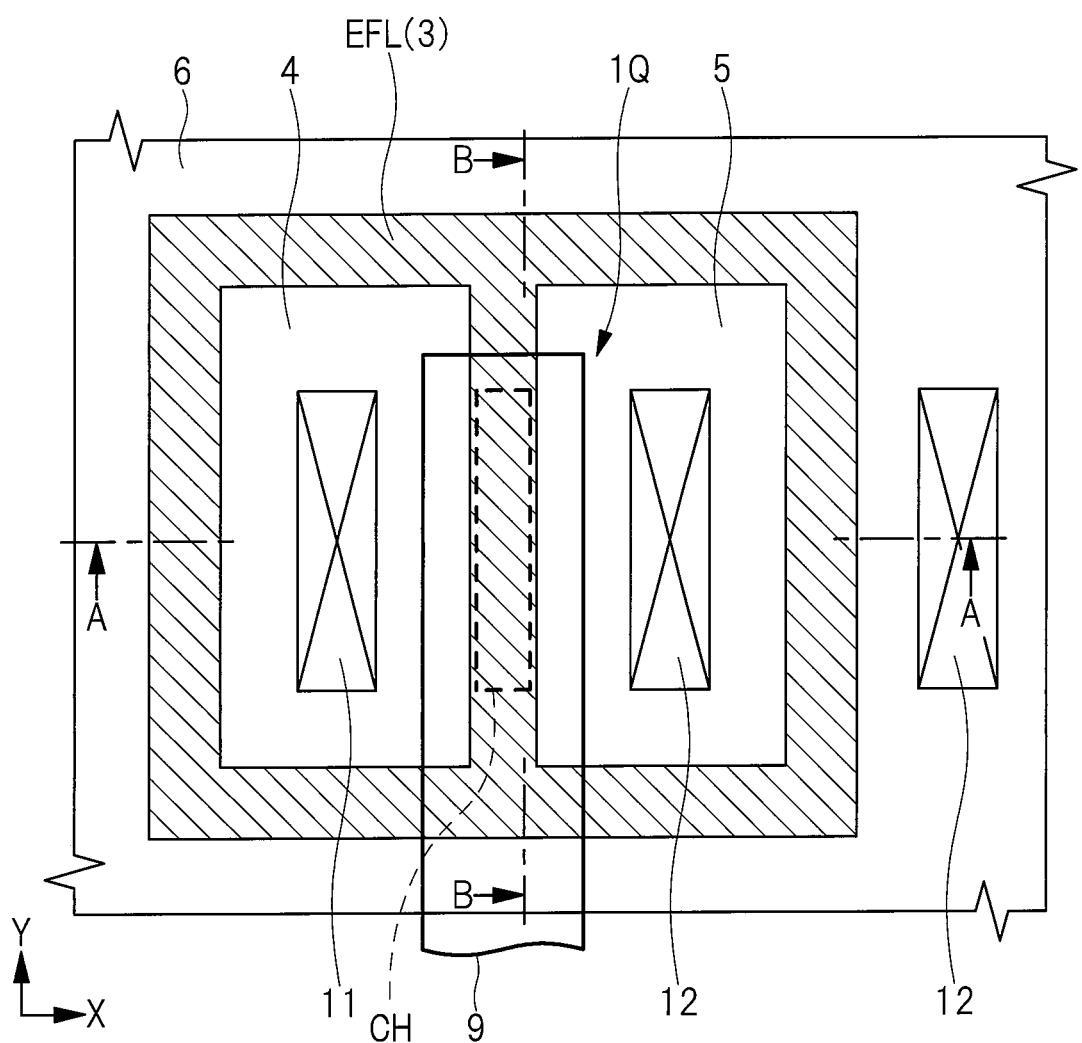
FIG. 11 is a plan view of a semiconductor device according to a third embodiment.
Figure 12:
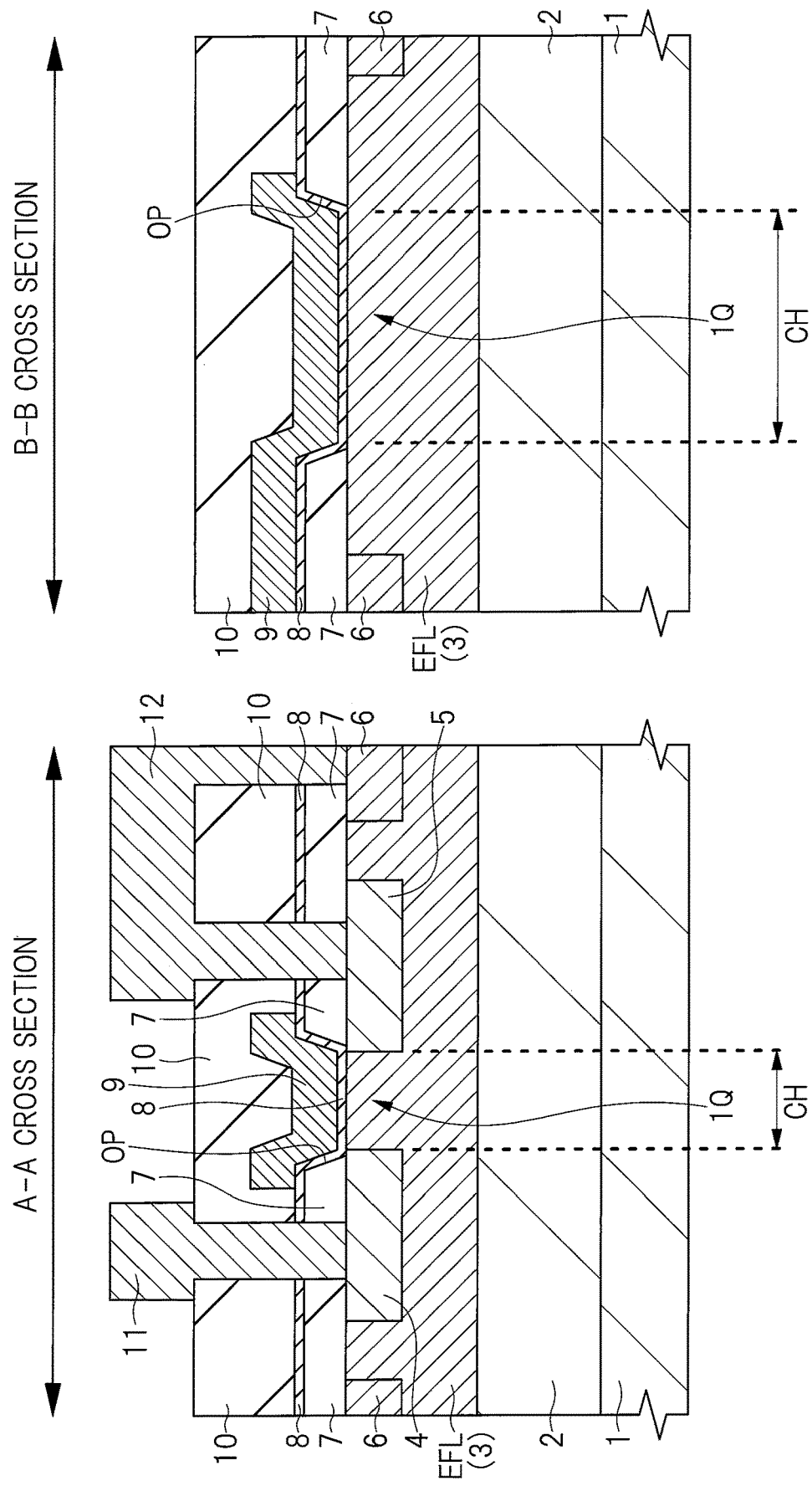
FIG. 12 is a cross-sectional view of the semiconductor device according to the third embodiment.

In the third embodiment, as shown in FIG. 11 and FIG. 12, the field relaxation layer EFL is formed in the whole region where the impurity region 3 is formed in the first embodiment. Accordingly, the field relaxation layer EFL is formed in the whole region between the drain region 4 and the source region 5 in plan view. In other words, the field relaxation layer EFL is formed not only below the field insulating film 7 but also below the gate insulating film 8. Therefore, the effective channel region CH constitutes a part of the field relaxation layer EFL. Note that the impurity concentration of the field relaxation layer EFL (impurity region 3) in the third embodiment is preferably $1 \times 10^{16}/cm^3$ or higher and more preferably $3 \times 10^{17}/cm^3$ or higher as with the first embodiment.

As described above, although the first embodiment is superior from the viewpoint of the degree of freedom in the design of the MISFET 1Q or the like, the manufacturing cost can be reduced in the third embodiment because it is not necessary to separately form the impurity region 3 and the field relaxation layer EFL.

Note that the semiconductor device mentioned above can be manufactured by forming the field relaxation layer EFL in the region where the impurity region 3 is formed in FIG. 6. In this case, the process of forming the field relaxation layer EFL described with reference to FIG. 6 can be omitted.

Fourth Embodiment

A semiconductor device according to the fourth embodiment will be described below with reference to FIG. 13 and FIG. 14. Note that the difference between the first embodiment and the fourth embodiment will be mainly described in the following description.

In the first embodiment, the body region 6 and the field relaxation layer EFL are formed individually. Thus, the degree of freedom in the design of the MISFET 1Q can be enhanced while achieving both of the performance required for the transistor and the reduction of the leakage current caused by the interface defect.

Figure 13:
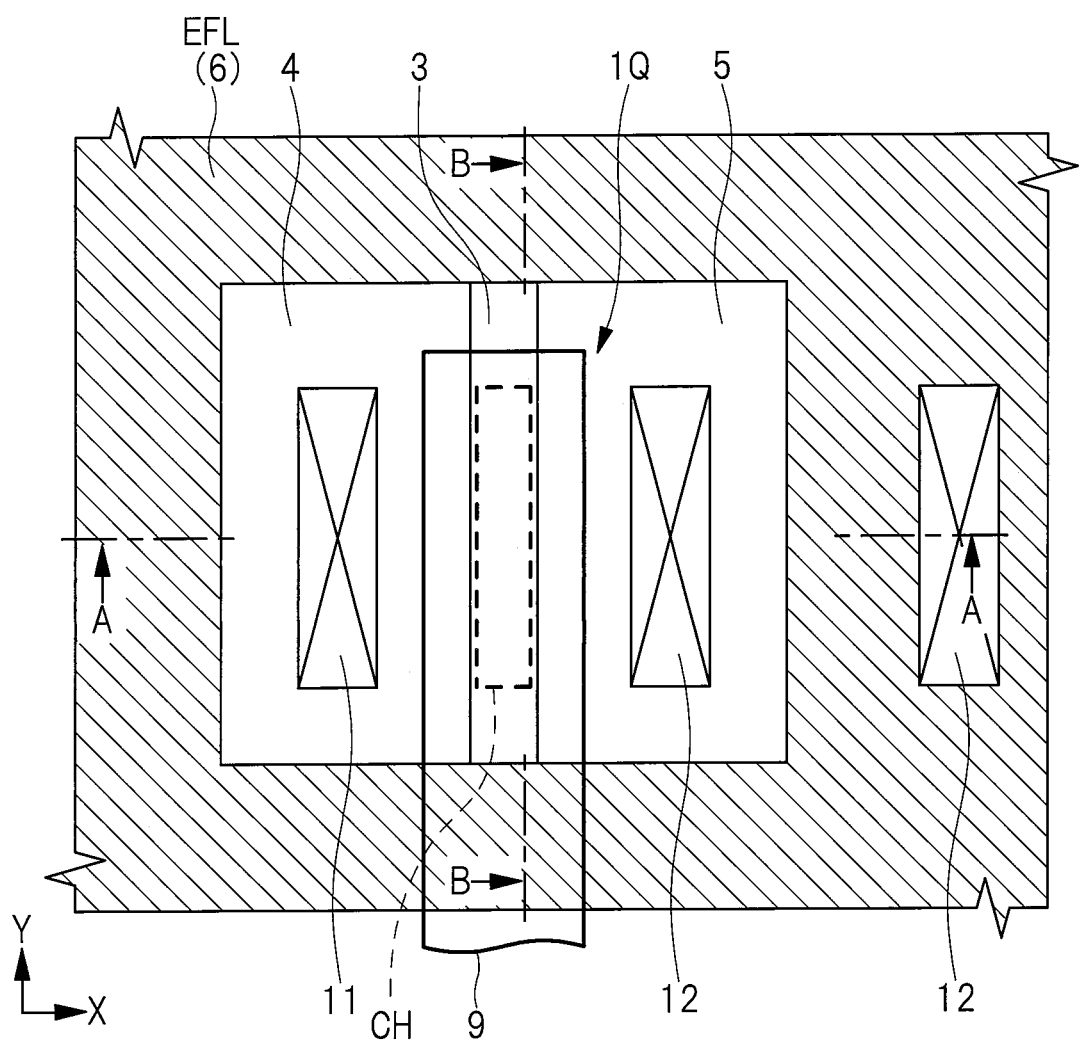
FIG. 13 is a plan view of a semiconductor device according to a fourth embodiment.
Figure 14:
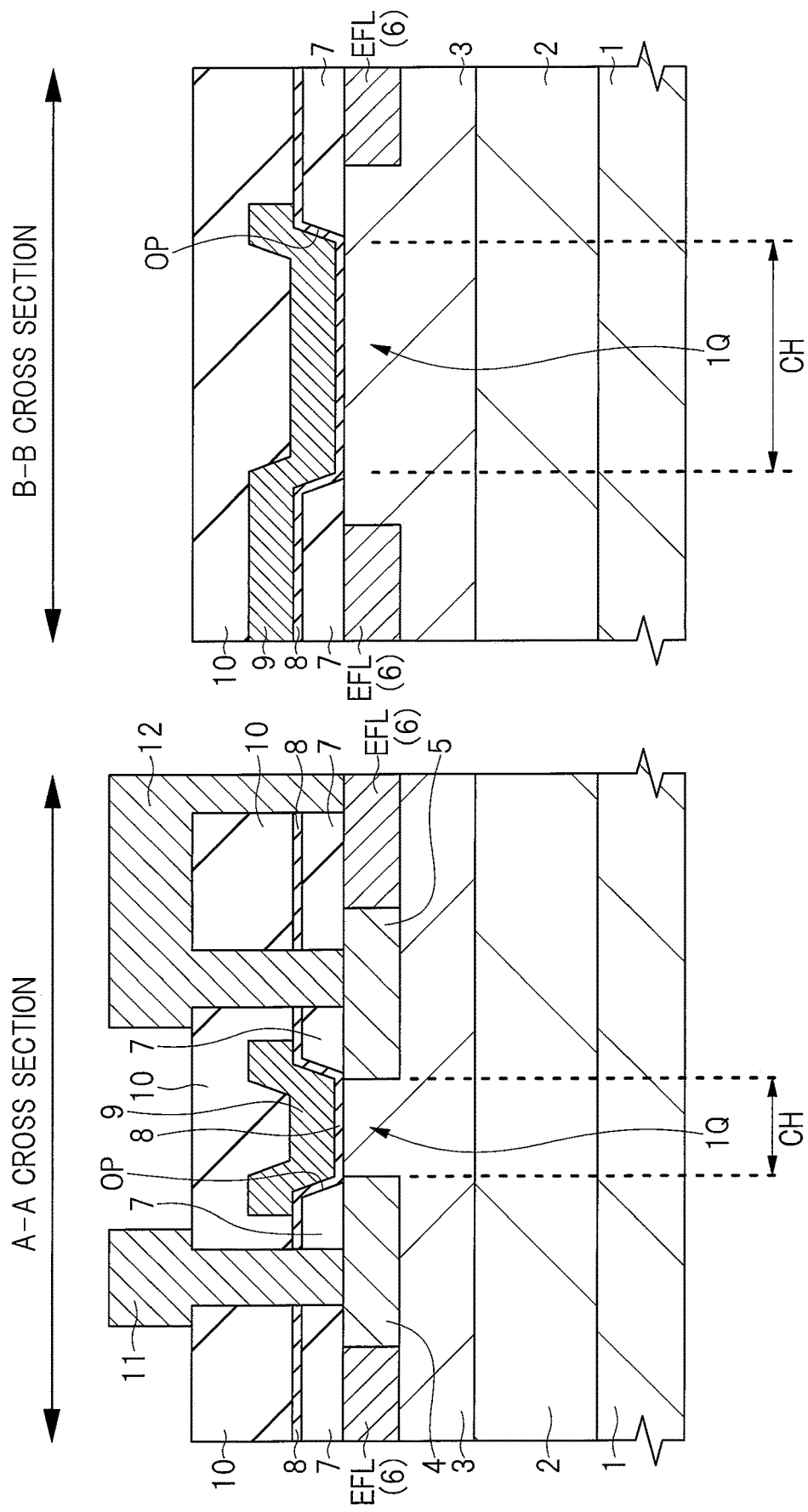
FIG. 14 is a cross-sectional view of the semiconductor device according to the fourth embodiment.

In the fourth embodiment, as shown in FIG. 13 and FIG. 14, the body region 6 and the field relaxation layer EFL are unified and the body region 6 and the field relaxation layer EFL have the same impurity concentration. In other words, the body region 6 is formed as a part of the field relaxation layer EFL. Note that the impurity concentration of the field relaxation layer EFL (body region 6) in the fourth embodiment is preferably $1 \times 10^{16}/cm^3$ or higher and more preferably $3 \times 10^{17}/cm^3$ or higher as with the first embodiment.

As described above, although the first embodiment is superior from the viewpoint of the degree of freedom in the design of the MISFET 1Q or the like, the manufacturing cost can be reduced in the fourth embodiment because it is not necessary to separately form the body region 6 and the field relaxation layer EFL.

Note that the semiconductor device mentioned above can be manufactured by forming the field relaxation layer EFL by the ion implantation in the region where the body region 6 is formed in FIG. 6. In this case, the process of forming the body region 6 described with reference to FIG. 6 can be omitted.

Moreover, it is also possible to apply the technology disclosed in the fourth embodiment to the semiconductor device according to the second embodiment. Namely, the field relaxation layer EFL which is the body region 6 may be in contact with the effective channel region CH in the gate width direction (Y direction).

Fifth Embodiment

Figure 15:
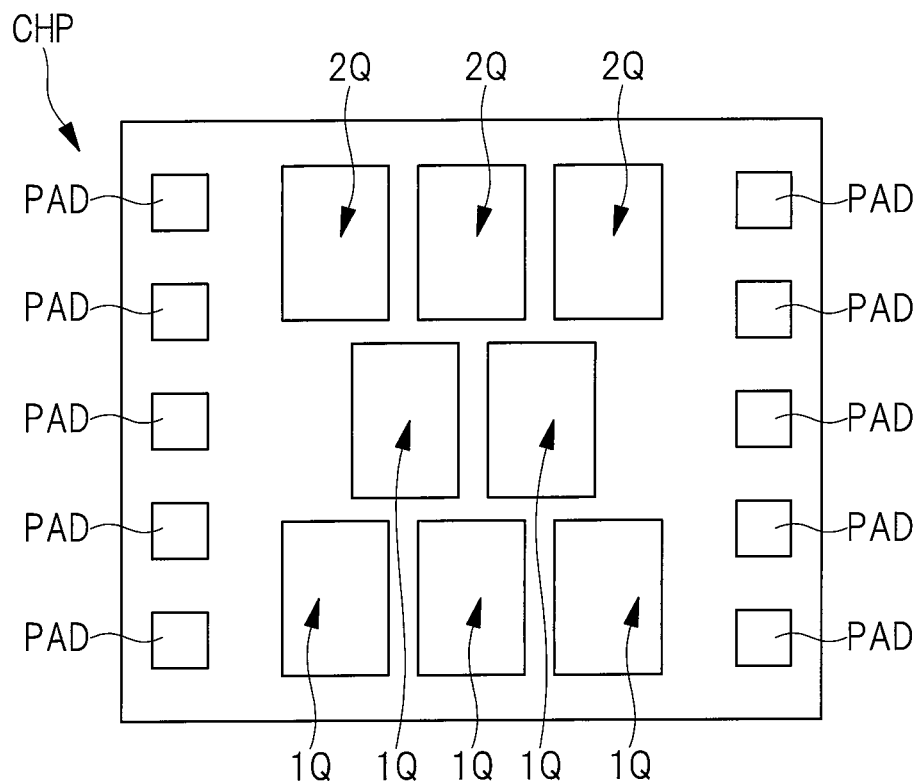
FIG. 15 is a plan view showing a layout of a semiconductor chip which is a semiconductor device according to a fifth embodiment.

A semiconductor device according to the fifth embodiment will be described below with reference to FIG. 15. FIG. 15 is a plan view of the semiconductor chip CHP which is the semiconductor device according to the fifth embodiment. Note that the difference between the first embodiment and the fifth embodiment will be mainly described in the following description.

The semiconductor chip CHP according to the fifth embodiment includes a plurality of n type MISFETs 1Q, a plurality of p type MISFETs 2Q, and a plurality of pad electrodes PAD.

The n type MISFET 1Q is, for example, the MISFET 1Q described in the first embodiment. The p type MISFET 2Q is the element in which the conductivity type of the components of the MISFET 1Q (impurity region 3, drain region 4, source region 5, body region 6, field relaxation layer EFL, and gate electrode 9) are reversed. The pad electrode PAD is, for example, a conductive film such as an aluminum film and is provided for electrically connecting the semiconductor chip CHP and an external device outside the semiconductor chip CHP by, for example, a bonding wire or the like.

It is possible to apply the feature described in the first embodiment to a part or all of the plurality of n type MISFETs 1Q. Similarly, it is also possible to apply the feature described in the first embodiment to a part or all of the plurality of p type MISFETs 2Q except that the conductivity type of the respective components is reversed.

Note that the p type MISFET 2Q may not be provided with the n type field relaxation layer in the semiconductor chip CHP according to the fifth embodiment. In this case, the semiconductor chip CHP includes the plurality of n type MISFETs Q1 described above and the p type MISFETs 2Q which are not provided with the n type field relaxation layer.

Moreover, it is also possible to apply the technology disclosed in the fifth embodiment to the semiconductor devices according to the second to fourth embodiments.

Sixth Embodiment

An example in which the semiconductor device (semiconductor chip) described in each of the embodiments above is mounted in a pressure transmitter PT will be described in the sixth embodiment.

Figure 16:
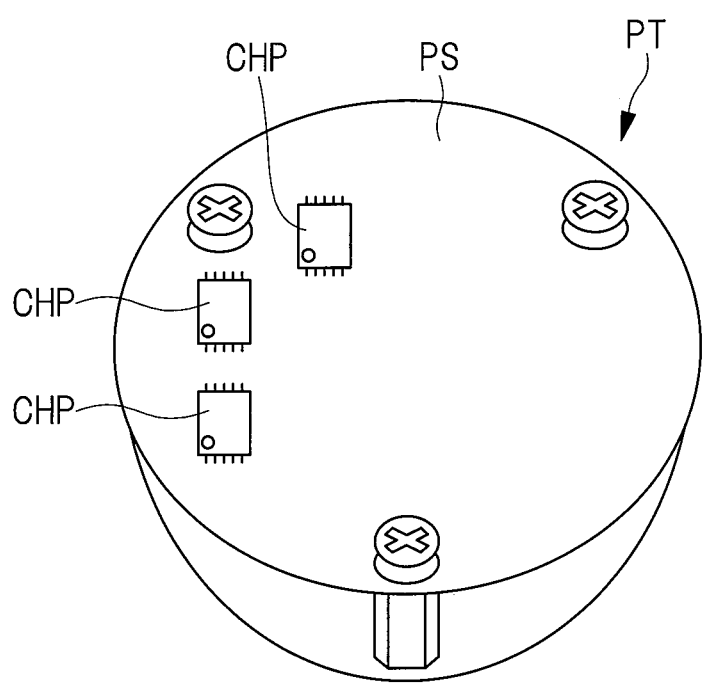
FIG. 16 is a schematic diagram showing a state where semiconductor chips which are semiconductor devices according to a sixth embodiment are mounted in a pressure transmitter.

FIG. 16 is a schematic diagram of the pressure transmitter PT. FIG. 16 shows the case where the plurality of semiconductor chips CHP described in the fifth embodiment among the semiconductor devices disclosed in the embodiments above are prepared and mounted in the pressure transmitter PT.

As shown in FIG. 16, the pressure transmitter PT includes a printed board PS and the plurality of semiconductor chips CHP are mounted on the printed board PS. A plurality of wirings are formed on the printed board PS, and the plurality of wirings and the pad electrodes PAD of the semiconductor chips CHP are electrically connected to each other through boding wires, lead frames, and others.

The pressure transmitter PT includes a mechanism that measures the pressure of, for example, gas, liquid, or vapor. The measured pressure signal is amplified via the semiconductor chip CHP, and the amplified pressure signal is output to the outside of the pressure transmitter PT. Thus, it is possible to create the pressure transmitter PT having excellent resistance in a harsh environment such as a radiation environment including γ rays by applying the semiconductor device disclosed in the present application such as the semiconductor chip CHP.

In the foregoing, the invention made by the inventors of the present invention has been concretely described based on the embodiments. However, the present invention is not limited to the foregoing embodiments and various modifications can be made within the scope of the present invention.

For example, the case where the oxynitriding treatment is performed to the gate insulating film 8 has been described in the foregoing embodiments, but the idea of the present application is not limited by the presence or absence of the oxynitriding treatment. Namely, even when the oxynitriding treatment is not performed, the leakage current caused by the interface defect can be reduced in the region between the drain region 4 and the source region 5 in plan view and below the field insulating film 7.

Moreover, the case where the field insulating film 7 is formed by the CVD method has been described in the foregoing embodiments, but the field insulating film 7 may be formed by the LOCOS (Local Oxide of Silicon) method.

In addition, a part of the contents described in the foregoing embodiments will be described below

APPENDIX 1

A manufacturing method of a semiconductor device comprising the steps of:
(a) preparing a semiconductor substrate of a first conductivity type made of silicon carbide;
(b) forming a semiconductor layer of the first conductivity type over the semiconductor substrate by an epitaxial growth method;
(c) forming a field relaxation layer of a second conductivity type opposite to the first conductivity type in the semiconductor layer by ion implantation;
(d) forming a drain region of the first conductivity type and a source region of the first conductivity type in the field relaxation layer by ion implantation;
(e) forming a field insulating film over the field relaxation layer so as to cover the drain region and the source region;
(f) forming an opening in the field insulating film so as to selectively open a part of the field relaxation layer located between the drain region and the source region;
(g) forming a gate insulating film having a thickness smaller than that of the field insulating film over the field relaxation layer in the opening; and
(h) forming a gate electrode on the gate insulating film, wherein an impurity concentration of the field relaxation layer located between the drain region and the source region in plan view is $3.0\times10^{17}/cm^3$ or higher.

What is claimed is:

1. A semiconductor device comprising:
a semiconductor substrate of a first conductivity type made of silicon carbide;
a semiconductor layer of the first conductivity type formed over the semiconductor substrate;
a first impurity region of a second conductivity type opposite to the first conductivity type formed in the semiconductor layer;
a drain region of the first conductivity type and a source region of the first conductivity type formed in the first impurity region;
a field insulating film formed over the first impurity region, the drain region, and the source region and having an opening that selectively opens apart of the first impurity region located between the drain region and the source region;
a gate insulating film formed over the first impurity region in the opening and having a thickness smaller than that of the field insulating film; and
a gate electrode formed on the gate insulating film,
wherein a field relaxation layer having an impurity concentration higher than that of the first impurity region is formed in at least a part of the first impurity region located between the drain region and the source region in a plan view and located below the field insulating film.

2. The semiconductor device according to claim 1, wherein an impurity concentration of the field relaxation layer is $3.0\times10^{17}/cm^3$ or higher.

3. The semiconductor device according to claim 1, wherein the field relaxation layer is formed in a whole of the first impurity region located between the drain region and the source region in plan view and located below the field insulating film.

4. The semiconductor device according to claim 1, further comprising a body region of the second conductivity type formed in the first impurity region so as to surround the drain region and the source region in plan view and having an impurity concentration higher than that of the first impurity region,
wherein the field relaxation layer is formed also in the first impurity region located between the drain region and the body region and between the source region and the body region in plan view.

5. The semiconductor device according to claim 2, wherein the impurity concentration of the field relaxation layer is $3.0\times10^{17}/cm^3$ or higher and is equal to that of the body region, and
the body region is formed as a part of the field relaxation layer.

6. The semiconductor device according to claim 1, wherein the gate insulating film is formed also over the field insulating film outside the opening, and
the gate electrode is formed also over the field insulating film with the gate insulating film interposed therebetween in a first direction and a second direction orthogonal to the first direction in plan view.

7. The semiconductor device according to claim 1, further comprising a plurality of MISFETs each having the gate insulating film, the gate electrode, the source region, and the drain region,
wherein the plurality of MISFETs include:
a plurality of first MISFETs in which the first conductivity type is an n type and the second conductivity type is a p type; and
a plurality of second MISFETs in which the first conductivity type is a p type and the second conductivity type is an n type.

8. A pressure transmitter comprising a plurality of the semiconductor devices according to claim 7 mounted therein.

9. A semiconductor device comprising:
a semiconductor substrate of a first conductivity type made of silicon carbide;
a semiconductor layer of the first conductivity type formed over the semiconductor substrate;
a field relaxation layer of a second conductivity type opposite to the first conductivity type formed in the semiconductor layer;
a drain region of the first conductivity type and a source region of the first conductivity type selectively formed in the field relaxation layer;
a field insulating film formed over the field relaxation layer, the drain region, and the source region and having an opening that selectively opens a part of the field relaxation layer located between the drain region and the source region;

a gate insulating film formed over the field relaxation layer in the opening; and a gate electrode formed on the gate insulating film, wherein an impurity concentration of the field relaxation layer located between the drain region and the source region in plan view is $3.0 \times 10^{17}/cm^3$ or higher.

10. A manufacturing method of a semiconductor device comprising the steps of:

(a) preparing a semiconductor substrate of a first conductivity type made of silicon carbide;

(b) forming a semiconductor layer of the first conductivity type over the semiconductor substrate by an epitaxial growth method;

(c) forming a first impurity region of a second conductivity type opposite to the first conductivity type in the semiconductor layer by ion implantation;

(d) forming a drain region of the first conductivity type and a source region of the first conductivity type in the first impurity region by ion implantation;

(e) forming a field relaxation layer having an impurity concentration higher than that of the first impurity region by ion implantation in the first impurity region so as to be located between the drain region and the source region in plan view;

(f) forming a field insulating film over the first impurity region so as to cover the drain region, the source region, and the field relaxation layer;

(g) forming an opening in the field insulating film so as to selectively open a part of the first impurity region located between the drain region and the source region;

(h) forming a gate insulating film having a thickness smaller than that of the field insulating film over the first impurity region in the opening; and (i) forming a gate electrode on the gate insulating film.

11. The manufacturing method of a semiconductor device according to claim 10 further comprising the step of (j) performing oxynitriding treatment so that an interface between the gate insulating film and the first impurity region is nitrided between the step (h) and the step (i).

12. The manufacturing method of a semiconductor device according to claim 10, wherein the impurity concentration of the field relaxation layer is $3.0 \times 10^{17}/cm^3$ or higher.

13. The manufacturing method of a semiconductor device according to claim 10 further comprising the step of (k) forming a body region of the second conductivity type having an impurity concentration higher than that of the first impurity region in the first impurity region so as to surround the drain region and the source region with the field relaxation layer interposed therebetween in plan view before the step (f).

14. The manufacturing method of a semiconductor device according to claim 13, wherein the step (e) and the step (k) are performed as separate steps.

15. The manufacturing method of a semiconductor device according to claim 13, wherein the step (e) and the step (k) are performed as a single step, and the body region is formed as the field relaxation layer.

* * * * *